US012598874B2

(12) United States Patent
Zhang et al.

(10) Patent No.: US 12,598,874 B2
(45) Date of Patent: Apr. 7, 2026

(54) DISPLAY PANEL AND METHOD FOR MANUFACTURING THE SAME, AND DISPLAY APPARATUS

(71) Applicant: BOE TECHNOLOGY GROUP CO., LTD., Beijing (CN)

(72) Inventors: Haohan Zhang, Beijing (CN); Jia Liu, Beijing (CN)

(73) Assignee: BOE TECHNOLOGY GROUP CO. , LTD., Beijing (CN)

( * ) Notice: Subject to any disclaimer, the term of this patent is extended or adjusted under 35 U.S.C. 154(b) by 617 days.

(21) Appl. No.: 17/772,851

(22) PCT Filed: Apr. 14, 2021

(86) PCT No.: PCT/CN2021/087092
§ 371 (c)(1),
(2) Date: Apr. 28, 2022

(87) PCT Pub. No.: WO2021/238472
PCT Pub. Date: Dec. 2, 2021

(65) Prior Publication Data
US 2022/0392969 A1     Dec. 8, 2022

(30) Foreign Application Priority Data

May 29, 2020     (CN) .......................... 202010477280.0

(51) Int. Cl.
*H10K 59/131*     (2023.01)
*H10K 59/12*     (2023.01)
*H10K 59/35*     (2023.01)

(52) U.S. Cl.
CPC ......... *H10K 59/131* (2023.02); *H10K 59/353* (2023.02); *H10K 59/1201* (2023.02)

(58) Field of Classification Search
CPC .... H10K 59/353; H10K 59/131; H10K 59/65; H10K 71/00; H10K 59/1201
See application file for complete search history.

(56) References Cited

U.S. PATENT DOCUMENTS

| | | | | |
|---|---|---|---|---|
| 2011/0043499 A1* | 2/2011 | Cok | ........................ | H10K 71/70 |
| | | | | 345/82 |
| 2016/0378233 A1* | 12/2016 | Huo | ...................... | G06F 3/0446 |
| | | | | 345/174 |

(Continued)

FOREIGN PATENT DOCUMENTS

| | | |
|---|---|---|
| CN | 109801950 A | 5/2019 |
| CN | 110767085 A | 2/2020 |

(Continued)

*Primary Examiner* — Jay C Kim
*Assistant Examiner* — Woo K Lee
(74) *Attorney, Agent, or Firm* — XSENSUS LLP

(57)     ABSTRACT

A display panel has a first region and a second region, and includes a substrate, and first electrodes in the first region, light-emitting layers, second electrodes, scanning signal lines and data signal lines that are disposed on the substrate; a first electrode extends in a first direction and includes first electrode blocks; an orthogonal projection, on the substrate, of a light-emitting layer is located in an orthogonal projection, on the substrate, of a first electrode block; a second electrode extends in a second direction and includes second electrode blocks, a second electrode block covers the light-emitting layer, and edges proximate to each other of any two adjacent second electrode blocks overlap; the second electrode blocks are staggered in the second direction; a scanning signal line connects the first electrode blocks in the first electrode in series; and a data signal line is coupled to the second electrode.

20 Claims, 15 Drawing Sheets

(56)          References Cited

U.S. PATENT DOCUMENTS

| | | |
|---|---|---|
| 2019/0250738 A1 | 8/2019 | Lee |
| 2019/0371865 A1 | 12/2019 | Lee et al. |
| 2020/0251539 A1 | 8/2020 | Fu |
| 2020/0303472 A1 | 9/2020 | Lou et al. |

FOREIGN PATENT DOCUMENTS

| | | | | |
|---|---|---|---|---|
| CN | 110767141 A | * | 2/2020 | ........... G09G 3/2074 |
| CN | 110767714 A | | 2/2020 | |
| CN | 110911440 A | | 3/2020 | |
| CN | 111599848 A | | 8/2020 | |
| CN | 111211150 B | * | 2/2024 | ............. H10K 59/60 |

* cited by examiner

A-A'

121(120)

132(130)

111(110)

101

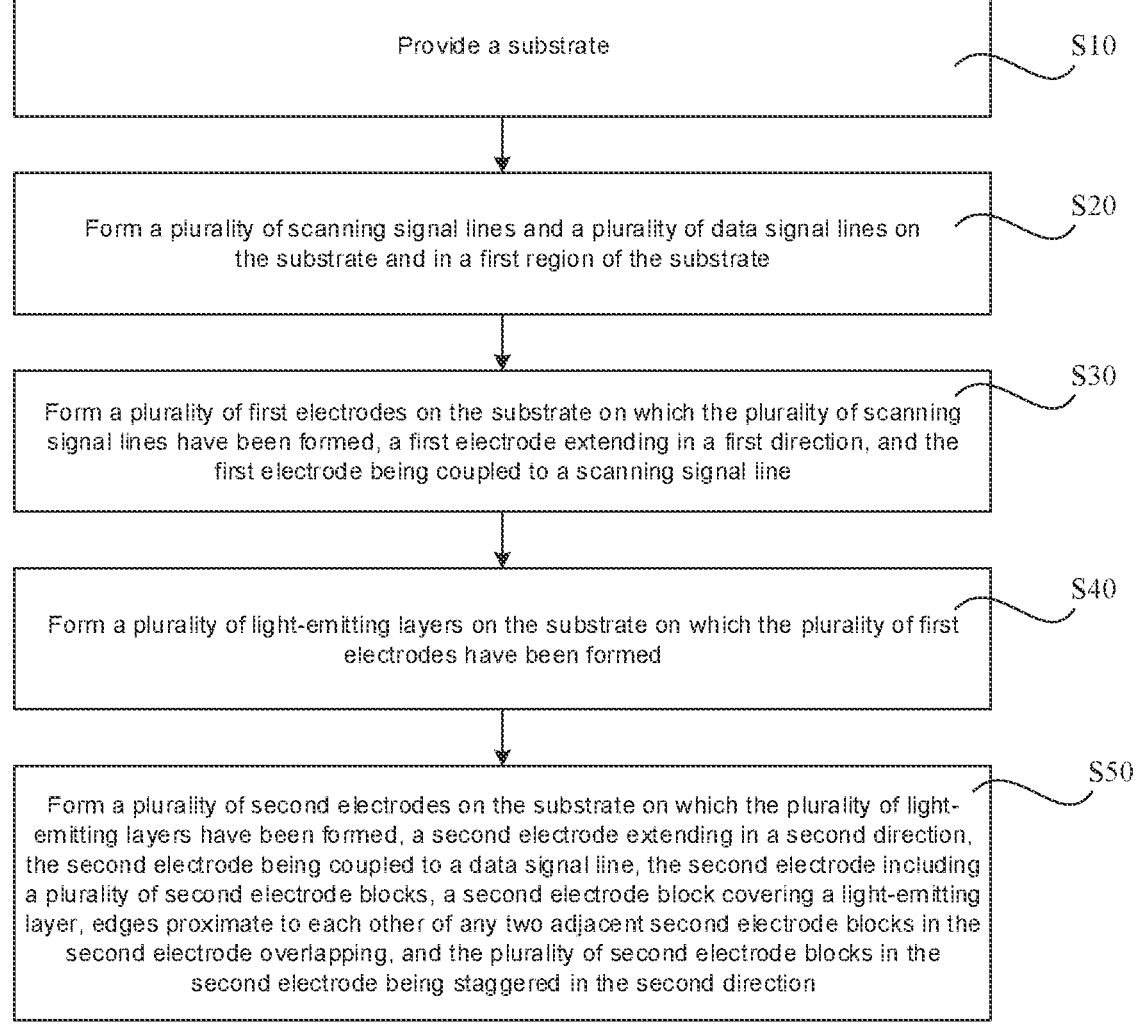

Provide a substrate — S10

Form a plurality of scanning signal lines and a plurality of data signal lines on the substrate and in a first region of the substrate — S20

Form a plurality of first electrodes on the substrate on which the plurality of scanning signal lines have been formed, a first electrode extending in a first direction, and the first electrode being coupled to a scanning signal line — S30

Form a plurality of light-emitting layers on the substrate on which the plurality of first electrodes have been formed — S40

Form a plurality of second electrodes on the substrate on which the plurality of light-emitting layers have been formed, a second electrode extending in a second direction, the second electrode being coupled to a data signal line, the second electrode including a plurality of second electrode blocks, a second electrode block covering a light-emitting layer, edges proximate to each other of any two adjacent second electrode blocks in the second electrode overlapping, and the plurality of second electrode blocks in the second electrode being staggered in the second direction — S50

FIG. 7

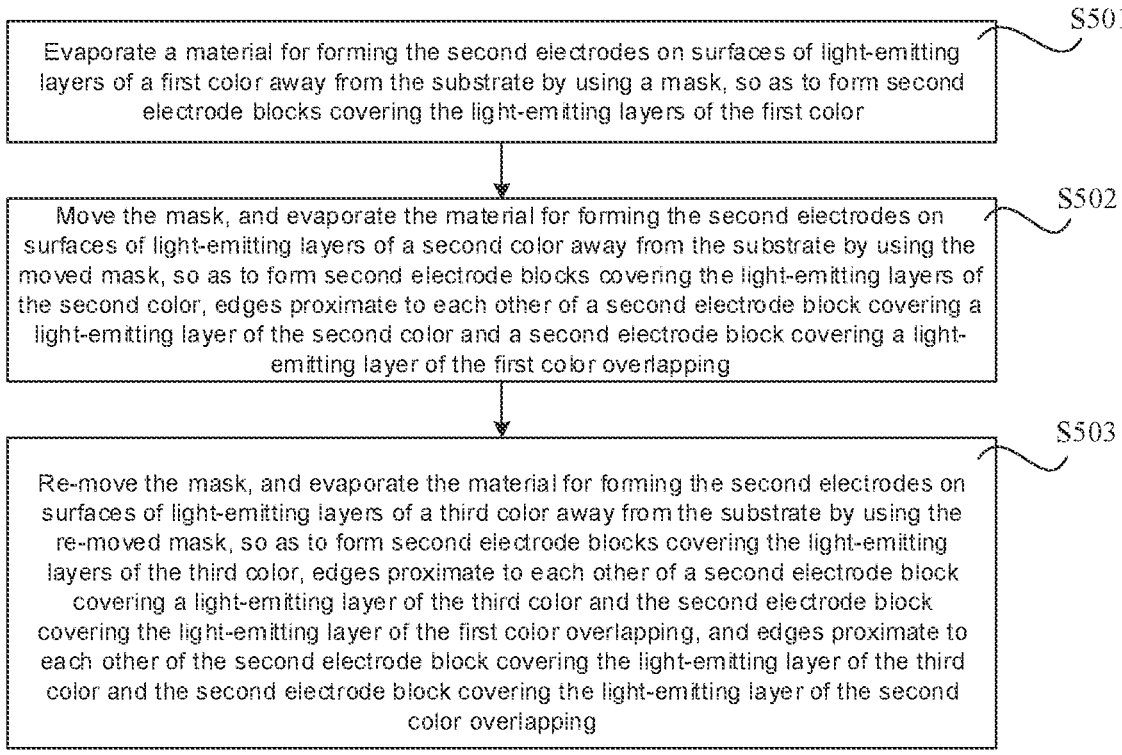

S501

Evaporate a material for forming the second electrodes on surfaces of light-emitting layers of a first color away from the substrate by using a mask, so as to form second electrode blocks covering the light-emitting layers of the first color

S502

Move the mask, and evaporate the material for forming the second electrodes on surfaces of light-emitting layers of a second color away from the substrate by using the moved mask, so as to form second electrode blocks covering the light-emitting layers of the second color, edges proximate to each other of a second electrode block covering a light-emitting layer of the second color and a second electrode block covering a light-emitting layer of the first color overlapping

S503

Re-move the mask, and evaporate the material for forming the second electrodes on surfaces of light-emitting layers of a third color away from the substrate by using the re-moved mask, so as to form second electrode blocks covering the light-emitting layers of the third color, edges proximate to each other of a second electrode block covering a light-emitting layer of the third color and the second electrode block covering the light-emitting layer of the first color overlapping, and edges proximate to each other of the second electrode block covering the light-emitting layer of the third color and the second electrode block covering the light-emitting layer of the second color overlapping

FIG. 8

DISPLAY PANEL AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/087092, filed on Apr. 14, 2021, which claims priority to Chinese Patent Application No. 202010477280.0, filed on May 29, 2020, which are incorporated herein by reference in their entirety.

TECHNICAL FIELD

The present disclosure relates to the field of display technologies, and in particular, to a display panel and a method for manufacturing the same, and a display apparatus.

BACKGROUND

With the advent of the "full screen" era, a high screen-to-body ratio has become a new development trend for electronic devices such as mobile phones and notebook computers. The screen-to-body ratio refers to a ratio of a screen area of a display screen to an area of an entire front face of the display screen. The display screen is designed to be a special-shaped display screen having a notch region, such as a bang screen or a water drop screen. A sensor of the display screen such as a camera and a light sensor may be disposed in the notch region to improve the screen-to-body ratio of the screen. However, the special-shaped display screen is not a true "full screen" as the notch region thereof cannot realize display, thus reducing the screen-to-body ratio.

The sensor is placed under the display screen, for example, the camera is placed under the display screen, so that a region of the display screen where the sensor is located can realize both sensing function and display. As a result, the screen-to-body ratio is improved.

SUMMARY

In an aspect, a display panel is provided. The display panel has a first region and a second region. The first region and the second region are each provided with a plurality of sub-pixels therein; and a distribution density of sub-pixels in the first region is less than a distribution density of sub-pixels in the second region. The display panel includes a substrate, a plurality of first electrodes, a plurality of light-emitting layers, a plurality of second electrodes, a plurality of scanning signal lines, and a plurality of data signal lines.

The plurality of first electrodes are disposed on the substrate and located in the first region; a first electrode extends in a first direction; and the first electrode includes a plurality of first electrode blocks. The plurality of light-emitting layers are disposed on a side of the plurality of first electrodes away from the substrate; a light-emitting layer is located in a sub-pixel; and an orthogonal projection, on the substrate, of the light-emitting layer is located in a range of an orthogonal projection, on the substrate, of a first electrode block.

The plurality of second electrodes are disposed on a side of the plurality of light-emitting layers away from the substrate; a second electrode extends in a second direction, and the first direction intersects the second direction; the second electrode includes a plurality of second electrode blocks, a second electrode block covers the light-emitting layer, and edges proximate to each other of any two adjacent second electrode blocks in the second electrode overlap; and the plurality of second electrode blocks in the second electrode are staggered in the second direction. The plurality of scanning signal lines and the plurality of data signal lines are disposed on the substrate, a scanning signal line connects the plurality of first electrode blocks in the first electrode in series, and a data signal line is coupled to the second electrode.

In some embodiments, a geometric center of the second electrode block does not coincide with a geometric center of the light-emitting layer; and an orthogonal projection, on the substrate, of the light-emitting layer covered by the second electrode block does not overlap with an orthogonal projection, on the substrate, of a second electrode block overlapping with the second electrode block.

In some embodiments, the second electrode block has a first edge and a second edge. The second edge of the second electrode block overlaps with a second electrode block adjacent to the second electrode block, and the first edge of the second electrode block does not substantially overlap with the second electrode block adjacent to the second electrode block. A distance between an edge of an orthogonal projection, on the substrate, of the light-emitting layer proximate to an orthogonal projection, on the substrate, of the first edge of the second electrode block and the orthogonal projection, on the substrate, of the first edge is a first distance, a distance between an edge of the orthogonal projection, on the substrate, of the light-emitting layer proximate to an orthogonal projection, on the substrate, of the second edge of the second electrode block and the orthogonal projection, on the substrate, of the second edge is a second distance, and the first distance is less than the second distance.

In some embodiments, widths of overlapping portions of two adjacent second electrode blocks are less than or equal to a difference between the second distance and the first distance.

In some embodiments, a distance between an edge of an orthogonal projection, on the substrate, of a second electrode block overlapping with the second electrode block proximate to the orthogonal projection, on the substrate, of the light-emitting layer and the orthogonal projection, on the substrate, of the light-emitting layer is equal to the first distance.

In some embodiments, the first distance is in a range of 10 μm to 12 μm, inclusive, the second distance is in a range of 16 μm to 20 μm, inclusive, and a width of a portion of the second electrode block overlapping with an adjacent second electrode block is in a range of 6 μm to 8 μm, inclusive.

In some embodiments, a shape of an orthogonal projection, on the substrate, of the second electrode block, and a shape of an orthogonal projection, on the substrate, of the light-emitting layer are same as a shape of an orthogonal projection, on the substrate, of the first electrode block; and the shape of the orthogonal projection, on the substrate, of the second electrode block is a quadrilateral or a hexagon.

In some embodiments, in the second electrode, an extension direction of a line connecting geometric centers of two second electrode blocks overlapping with the second electrode block is parallel or substantially parallel to the second direction; and an included angle between an extension direction of a line connecting geometric centers of any two adjacent second electrode blocks and the first direction is an acute angle.

In some embodiments, in the second electrode, overlapping portions of any two adjacent second electrode blocks have a same width.

In some embodiments, the plurality of light-emitting layers include light-emitting layers of a first color, light-emitting layers of a second color, and light-emitting layers of a third color. Light emitted by light-emitting layers covered by the first electrode has a same color; and in a region where the second electrode is located, light-emitting layers of the first color, light-emitting layers of the second color, and light-emitting layers of the third color are arranged sequentially and cyclically and staggered, and light emitted by adjacent light-emitting layers have different colors.

In some embodiments, the plurality of second electrode blocks in the second electrode are divided into a plurality of electrode block groups, and each electrode block group includes six second electrode blocks that overlap sequentially.

A distance between geometric centers of two light-emitting layers of a same color in light-emitting layers covered by the six second electrode blocks in the electrode block group in the second direction is equal to a distance between geometric centers of two adjacent light-emitting layers of a same color in region where the first electrode is located in the first direction.

In some embodiments, the scanning signal line includes a first line segment and a second line segment coupled to the first line segment. The first line segment extends in the first direction, and the second line segment extends in the second direction; and the first line segment connects the plurality of first electrode blocks in the first electrode in series. A plurality of second line segments of the plurality of scanning signal lines are located on two opposite sides of the plurality of first electrodes in the first direction.

In some embodiments, a first electrode of any two adjacent first electrodes is coupled to a second line segment, which is located on a side of the plurality of first electrodes in the first direction, of a scanning signal line; and another first electrode of the any two adjacent first electrodes is coupled to a second line segment, which is located on another side of the plurality of first electrodes in the first direction, of a scanning signal line.

In some embodiments, the scanning signal line includes a first line segment and a second line segment coupled to the first line segment. The first line segment extends in the first direction, and the second line segment extends in the second direction; and the first line segment connects the plurality of first electrode blocks in the first electrode in series. A plurality of second line segments of the plurality of scanning signal lines are located on a side of two opposite sides of the plurality of first electrodes in the first direction.

In some embodiments, the plurality of scanning signal lines and the plurality of data signal lines are arranged in a same layer and made of a same material.

In some embodiments, the plurality of data signal lines are located on a side of the plurality of second electrodes away from the second region in the second direction.

In another aspect, a display apparatus is provided. The display apparatus includes the display panel as described in any of the above embodiments and a driver chip. The driver chip is bonded to the display panel and coupled to the plurality of data signal lines in the display panel.

In yet another aspect, a method for manufacturing the display panel as described in any of the above embodiments is provided. The method includes:

providing the substrate; and forming the plurality of scanning signal lines and he plurality of data signal lines on the substrate and in the first region of the substrate;

forming the plurality of first electrodes on the substrate on which the plurality of scanning signal lines have been formed, the first electrode extending in the first direction, and the first electrode being coupled to the scanning signal line;

forming the plurality of light-emitting layers on the substrate on which the plurality of first electrodes have been formed; and forming the plurality of second electrodes on the substrate on which the plurality of light-emitting layers have been formed; the second electrodes extending in the second direction, and the second electrode being coupled to the data signal line; the second electrode including the plurality of second electrode blocks, the second electrode block covering the light-emitting layer, and edges proximate to each other of any two adjacent second electrode blocks in the second electrode overlapping; and the plurality of second electrode blocks in the second electrode being staggered in the second direction.

In some embodiments, the plurality of light-emitting layers include light-emitting layers of a first color, light-emitting layers of a second color, and light-emitting layers of a third color, and forming the plurality of second electrodes on the substrate on which the plurality of light-emitting layers have been formed includes:

evaporating a material for forming the second electrodes on surfaces of the light-emitting layers of the first color away from the substrate by using a mask, so as to form second electrode blocks covering the light-emitting layers of the first color;

moving the mask, and evaporating the material for forming the second electrodes on surfaces of the light-emitting layers of the second color away from the substrate by using the moved mask, so as to form second electrode blocks covering the light-emitting layers of the second color; edges proximate to each other of a second electrode block covering a light-emitting layer of the second color and a second electrode block covering a light-emitting layer of the first color overlapping; and re-moving the mask; and evaporating the material for forming the second electrodes on surfaces of the light-emitting layers of the third color away from the substrate by using the re-moved mask, so as to form second electrode blocks covering the light-emitting layers of the third color; edges proximate to each other of a second electrode block covering a light-emitting layer of the third color and the second electrode block covering the light-emitting layer of the first color overlapping, and edges proximate to each other of the second electrode block covering the light-emitting layer of the third color the second electrode block covering the light-emitting layer of the second color overlapping,

BRIEF DESCRIPTION OF THE DRAWINGS

In order to describe technical solutions in the present disclosure more dearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

FIG. 7 is a flow diagram of a method for manufacturing a display panel, in accordance with some embodiments;

FIG. 8 is flow diagram of another method for manufacturing a display panel, in accordance with some embodiments.

DETAILED DESCRIPTION

Figure 1:
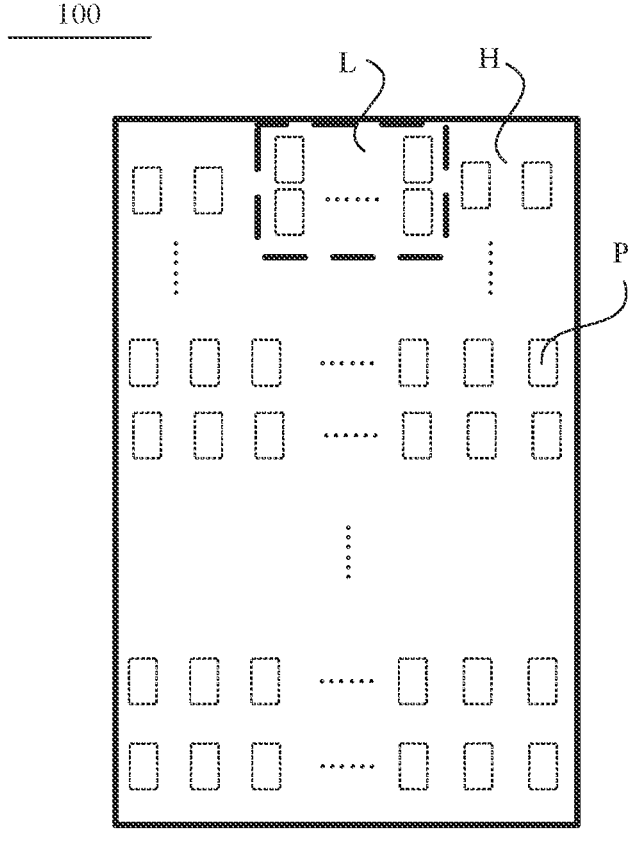
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, throughout the description and the claims, Is the term "comprise" and other forms thereof such as the third-person singular form "comprises" and the present participle form "comprising" are construed in an open and inclusive meaning, i.e., "including, but not limited to". In the description of the specification, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified, Some embodiments may be described using the expressions "coupled" and "connected" along with their derivatives. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other but still cooperate or interact with each other. The embodiments disclosed herein are not necessarily limited to the content herein.

The use of the phrase "applicable to" or "configured to" herein means an open and inclusive expression, which does not exclude devices that are applicable to or configured to perform additional tasks or steps.

As used herein, the term "about", "substantially", or "approximately" includes a stated value and an average value within an acceptable range of deviation of a particular value. The acceptable range of deviation is determined by a person of ordinary skill in the art in view of measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Thus, the regions shown in the accompanying drawings are schematic in nature, and their shapes are not intended to show actual shapes of the regions in a device, and are not intended to limit the scope of the exemplary embodiments.

An active matrix organic light-emitting diode (AMOLED) technology is adopted in a display region of a display panel, and transmittances of signals are relatively low due to complex wirings of the display panel adopting the AMOLED technology. Therefore, if a sensor (e.g., a camera) is placed under the display panel, an effect of under-screen sensing is poor.

In this case, in the display panel adopting the AMOLED technology, a passive matrix organic light-emitting diode (PMOLED) technology is adopted in a region where the sensor is placed, so as to improve a transmittance of the region. In a conventional process of manufacturing PMOLEDs, a plurality of spacers may be formed in the region before cathodes of the PMOLEDs are formed, so as to break an entire cathode layer located in the region in a process of forming the cathode using an evaporation process. As a result, a plurality of strip-shaped cathodes are formed. However, due to a large coverage area of the cathodes, an overall transmittance of the region is reduced; and the plurality of spacers are arranged at intervals, which may cause interference of light entering under the screen, resulting in a glare phenomenon of the camera under the screen.

Embodiments of the present disclosure provide a display panel 100. As shown in FIG. 1, the display panel 100 has a first region L and a second region H. The first region L and the second region H are each provided with a plurality of sub-pixels P therein.

It will be noted that light exiting from a sub-pixel P is of a color. For example, the light exiting from the sub-pixel P is red light, green light, or blue light.

For example, the second region L may be located on at least one side of the first region H, or the first region H may surround the second region L A distribution density of sub-pixels in the first region L is less than a distribution density of sub-pixels in the second region H. In this way, a sensor, such as a camera, may be disposed in the first region L and under the display panel 100, so as to realize under-screen sensing.

Figure 2:
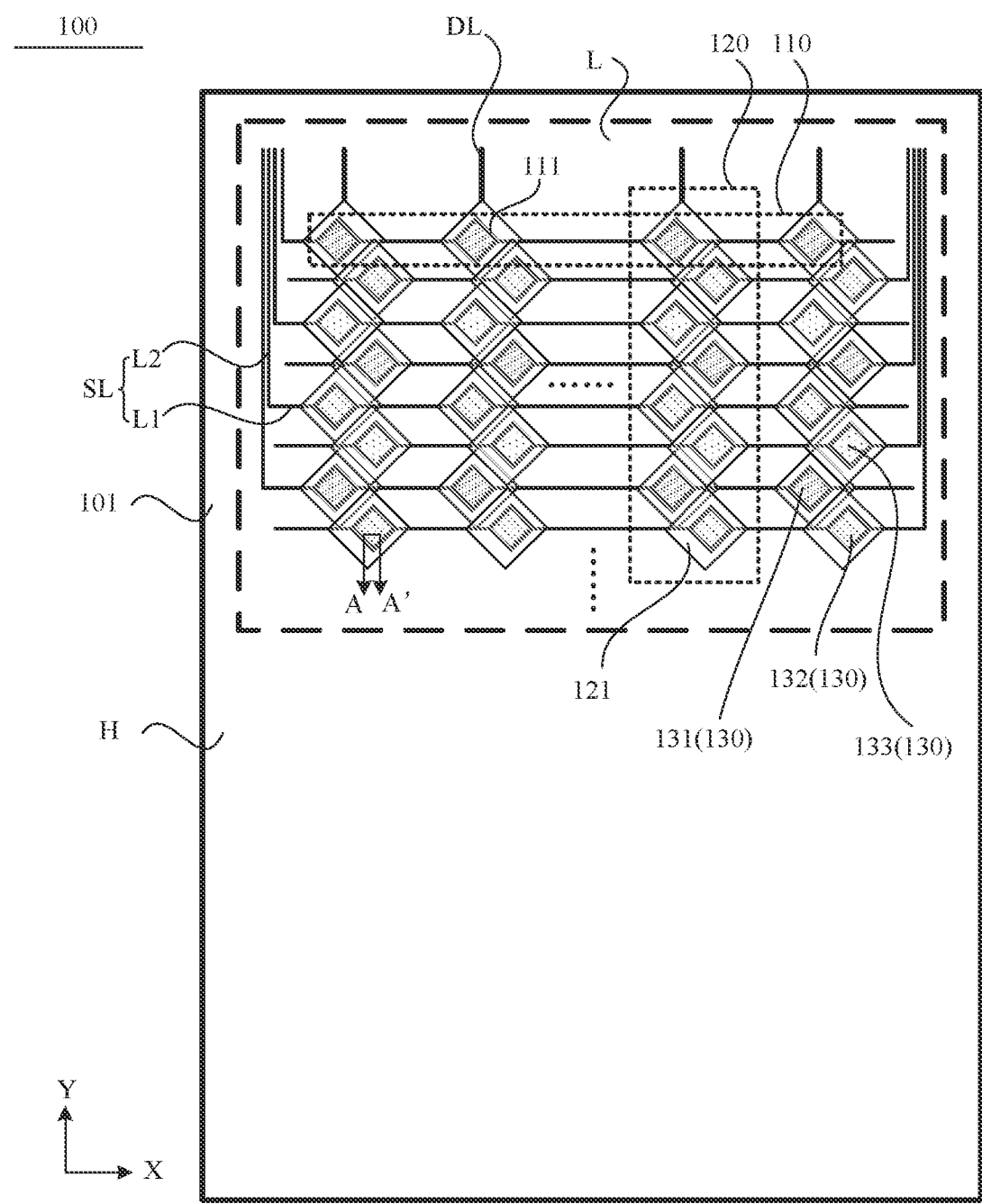
FIG. 2 is a structural diagram of another display panel, in accordance with some embodiments.

As shown in FIG. 2, the display panel 100 includes a substrate 101, a plurality of first electrodes 110, a plurality of light-emitting layers 130, a plurality of second electrodes 120, a plurality of scanning signal lines SL, and a plurality of data signal lines DL.

The plurality of first electrodes 110 are disposed on the substrate 101 and located in the first region L. The first electrodes 110 extend in a first direction X. The first electrode 110 includes a plurality of first electrode blocks 111.

Figure 3:
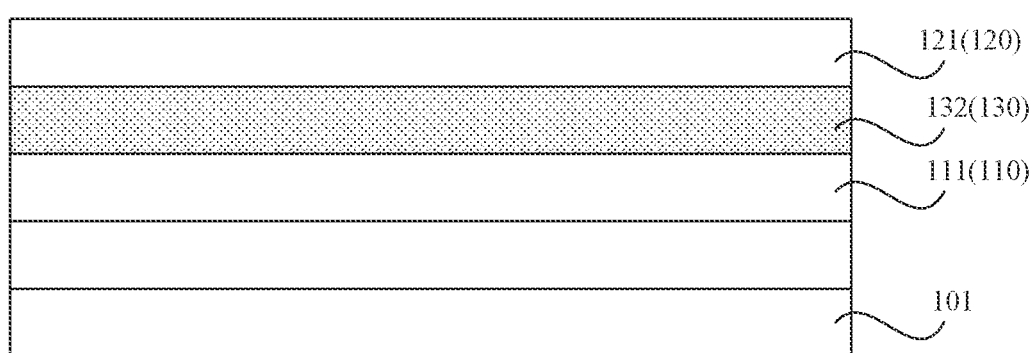
FIG. 3 is a sectional view of the display panel in FIG. 2 taken along the line A-A'.

As shown in FIGS. 2 and 3, the plurality of light-emitting layers 130 are disposed on a side of the plurality of first electrodes 110 away from the substrate 101.

A light-emitting layer 130 is located in a sub-pixel P. That is, the sub-pixel P includes the light-emitting layer 130.

An orthogonal projection, on the substrate 101, of the light-emitting layer 130 is located in an orthogonal projection, on the substrate 101, of a first electrode block 111.

It will be noted that a size of the orthogonal projection, on the substrate 101, of the light-emitting layer 130 may be regarded as a size of a light exiting area of the sub-pixel. That is, an edge of the orthogonal projection, on the substrate 101, of the light-emitting layer 130 is an edge of the light exiting region of the sub-pixel.

As shown in FIGS. 2 and 3, the plurality of second electrodes 120 are disposed on a side of the plurality of light-emitting layers 130 away from the substrate 101. The second electrodes 120 extend in a second direction Y, and the first direction X intersects the second direction Y.

For example, the first direction X and the second direction Y are perpendicular to each other.

As shown in FIG. 2, the second electrode 120 includes a plurality of second electrode blocks 121, a second electrode block 121 covers a light-emitting layer 130, and edges proximate to each other of any two adjacent second electrode blocks 121 in the second electrode 120 overlap. The plurality of second electrode blocks 121 in h second electrode 120 are staggered in the second direction Y.

It will be noted that the above-mentioned second electrode blocks 121 being staggered means that, geometric centers of the plurality of second electrode blocks 121 in the second electrode 120 are not completely in a straight line in the second direction Y. That is, a line sequentially connecting the geometric centers of the second electrode blocks 121 in the second electrode 120 in the second direction Y is a broken line.

For example, in the second electrode 120, an extension direction of a line connecting a geometric center of a second electrode block 121 and a geometric center of an adjacent second electrode block 121 intersects the second direction Y, and an extension direction of a line connecting geometric centers of two second electrode blocks 121 most adjacent to the second electrode block 121 is parallel to the second direction Y, In a case where adjacent second electrode blocks need to be coupled through a connection pattern, a second electrode includes a plurality of second electrode blocks, and further includes the connection pattern located between the two adjacent second electrode blocks. In this case, the plurality of second electrode blocks are arranged at intervals, and a space in which the connection pattern is formed needs to be left between two adjacent second electrode blocks; and a region where the second electrode is located includes regions where the plurality of second electrode blocks in the second electrode are located, and further includes regions where a plurality of connection patterns are located. However, in the display panel 100 in the embodiments of the present disclosure, the two adjacent second electrode blocks 121 in the second electrode 120 are overlapped with each other. That is, there is no gap between the two adjacent second electrode blocks 121. In this case, a region where the second electrode 120 is located includes only regions where the plurality of second electrode blocks 121 are located. Therefore, no connection pattern needs to be provided between the two adjacent second electrode blocks 121 in the display panel 100, which reduces a space between the two adjacent second electrode blocks 121.

Therefore, in the display panel 100 in the embodiments of the present disclosure, an area of the region where the second electrode 120 is located in the first region L is reduced, an area ratio of the plurality of second electrodes 120 to the first region L is reduced, and an area ratio of the plurality of second electrodes 120 to the display panel 100 is also reduced. As a result, a region in which the second electrodes 120 are not located of the first region L is increased, a transmittance of the first region L is improved, and a transmittance of the display panel 100 is improved. Thus, in a case where the sensor (e.g., the camera) is disposed in the first region L, it is beneficial for the sensor to receive a signal (e.g., the camera to receive light), so as to achieve a good under-screen sensing effect.

For example, under conditions of the same area of the display panel, the same area of the first region, the same distribution density of sub-pixels in the first region, and the same light exiting area and the same aperture ratio of the sub-pixel, in a case where adjacent second electrode blocks in the second electrode have a space therebetween and need to be coupled through the connection pattern, an area of a region not covered by the second electrodes in the first region accounts for approximately 25% of the area of the display panel, while in the embodiments of the present disclosure, the area of the region not covered by the second electrodes 120 in the first region L accounts for approximately 41% of the area of the display panel 100. Therefore, the transmittance of the display panel 100 in the embodiments of the present disclosure may be improved.

For example, the second electrode 120 including the plurality of second electrode blocks 121 in the display panel 100 may be directly formed through an evaporation process by using a mask, and there is no need to provide spacers in the display panel 100. In this way, in a case where the camera is disposed in the first region L and under the display panel 100, it is be possible to avoid a glare phenomenon of the camera due to interference of light passing through the spacers, and improve a shooting effect of the camera. In addition, in a process of manufacturing the display panel 100, no spacer needs to be formed before the second electrodes 120 are formed, thereby reducing manufacturing processes and improving manufacturing efficiency.

As shown in FIG. 2, the plurality of scanning signal lines SL and the plurality of data signal lines DL are disposed on the substrate 101.

A scanning signal line SL connects a plurality of first electrode blocks 111 in a first electrode 110 in series, and a data signal line DL is coupled to a second electrode 120.

The first electrode 110 is an anode, and the second electrode 120 is a cathode.

It will be understood that, the scanning signal line SL is configured to transmit a scanning signal to the first electrode 110, and the data signal line DL is configured to transmit a data signal to the second electrode 120. Thus, a light-emitting layer 130 located between the first electrode 110 and the second electrode 120 is controlled to emit light.

Therefore, in the display panel 100 provided in the embodiments of the present disclosure, the second electrode 120 includes the plurality of second electrode blocks 121, a second electrode block 121 covers a light-emitting layer 130, edges that are proximate to each other of any two adjacent second electrode blocks 121 in the second electrode 120 overlap, and the plurality of second electrode blocks 121 in the second electrode 120 are staggered in the second direction Y. In this case, compared with a display panel in which the connection patterns need to be provided, since adjacent second electrode blocks 121 in the second electrode 120 overlap with each other, there is no need to provide connection patterns additionally, an area of a region where the second electrode 120 is located is reduced, and the area ratio of the plurality of second electrodes 120 to the first region L is reduced. That is, the area ratio of the plurality of second electrodes 120 to the display panel 100 is reduced. Thus, the transmittance of the first region L is improved, and the transmittance of the display panel 100 is also improved; and in a case where the sensor (e.g., the camera) is disposed in the first region L, a good under-screen sensing effect may be achieved. In addition, the second electrode 120 including the plurality of second electrode blocks 121 in the display panel 100 may be directly formed through the evaporation process by using the mask, and there is no need to provide the spacers, which reduces the production processes, and improves the production efficiency. Furthermore, the glare phenomenon of the camera under the display panel 100 due to the interference of light passing through the spacers is avoided, and the shooting effect of the camera is improved.

Figure 4:
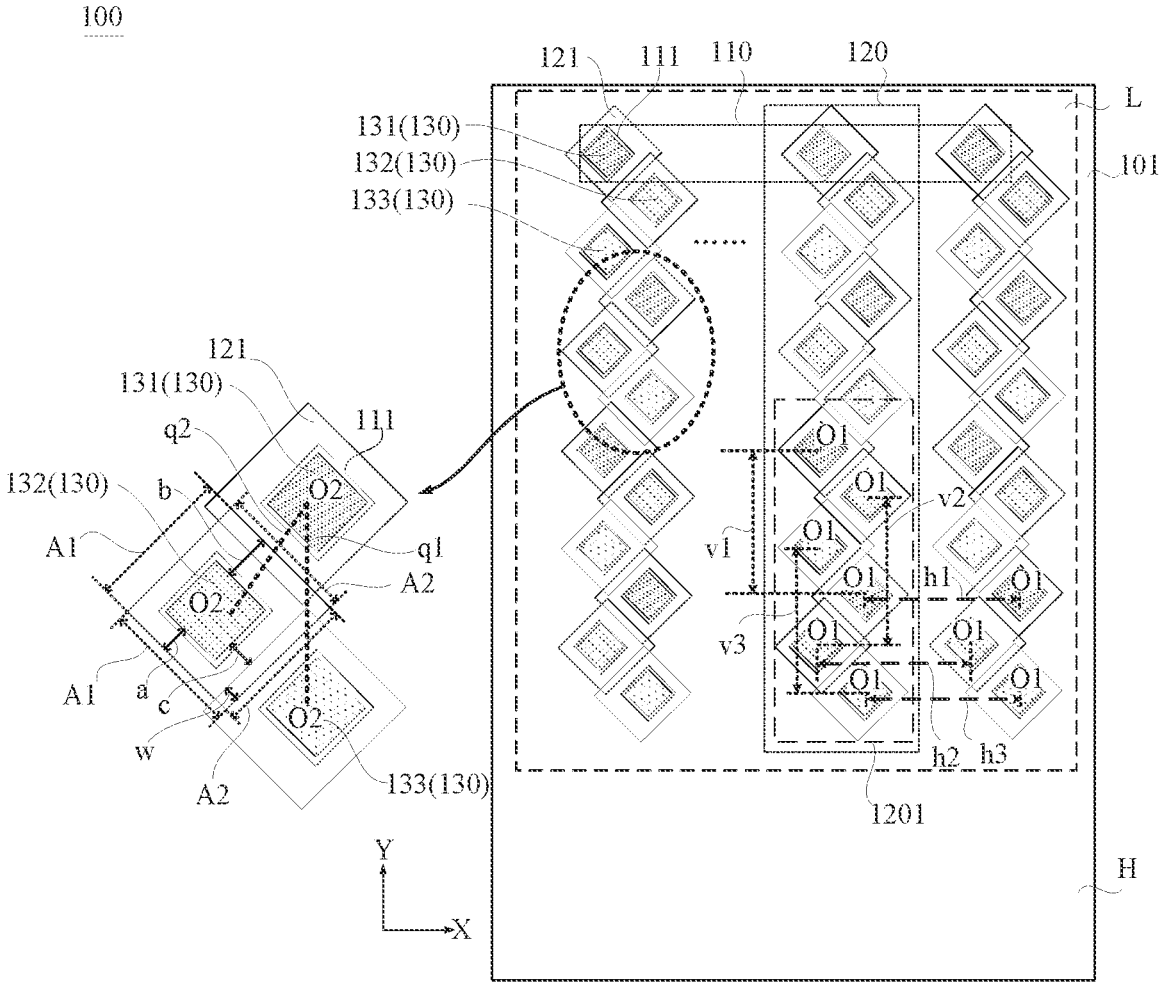
FIG. 4 is a structural diagram of yet another display panel, in accordance with some embodiments.

In some embodiments, as shown in FIG. 4, the geometric center O2 of the second electrode block 121 does not coincide with a geometric center O1 of the light-emitting layer 130. For example, the geometric center of the second electrode block refers to a geometric center of an orthogonal projection, on the substrate, of the second electrode block, and the geometric center of the light-emitting layer refers to a geometric center of an orthogonal projection, on the substrate, of the light-emitting layer.

An orthogonal projection, on the substrate 101, of a light-emitting layer 130 covered by a second electrode block 121 does not overlap with an orthogonal projection, on the substrate 101, of a second electrode block 121 overlapping with the second electrode block 121.

In this case, distances from edges of the orthogonal projection, on the substrate 101, of the second electrode block 121 to the orthogonal projection, on the substrate 101, of the light-emitting layer 130 covered by the second electrode block 121 are not completely equal, and a portion of the second electrode block 121 that does not cover the light-emitting layer 130 has a sufficient space for overlapping with an adjacent second electrode block 121. In addition, other second electrode blocks 121 overlapping with the second electrode block 121 may not cover the light-emitting layer 130 that is covered by the second electrode block 121, which may avoid a non-uniform thickness of a portion of the second electrode 120 covering the light-emitting layer 130, and thus normal light exiting of the light-emitting layer 130 may not be affected.

In some embodiments, as shown in FIG. 4, the second electrode block 121 has a first edge A1 and a second edge A2.

The second edge A2 of the second electrode block 121 overlaps with a second electrode block 121 adjacent to the second electrode block 121.

The first edge A1 of the second electrode block 121 does not substantially overlap with the second electrode block 121 adjacent to the second electrode block 121.

It will be noted that, in a case where the first edge A1 and the second edge A2 of the second electrode block 121 are adjacent, in an actual overlapping process, if the second edge A2 of the second electrode block 121 overlaps with the second electrode block 121 adjacent to the second electrode block 121, the first edge A1 of the second electrode block 121 may inevitably overlap with the second electrode block 121 adjacent is to the second electrode block 121. However, a length of an overlapping portion of the first edge A1 is very small relative to a length of an overlapping portion of the second edge A2. Therefore, it is considered that the first edge Al of the second electrode block 121 does not substantially overlap with the second electrode block 121 adjacent to the second electrode block 121.

For example, the length of the overlapping portion of the second edge A2 may account for 100%, 80%, or 60% of a total length of the second edge A2. The length of the overlapping portion of the second edge A2 may be a size of the overlapping portion of the second edge A2 in an extension direction of the second edge A2; the length of the overlapping portion of the first edge A1 may be a size of the overlapping portion of the first edge A1 in an extension direction of the first edge A1; and the length of the second edge A2 may be a size thereof in the extension direction thereof.

As shown in FIG. 4, a distance (i.e., a minimum distance) between an edge of the orthogonal projection, on the substrate 101, of the light-emitting layer 130 covered by the second electrode block 121 proximate to an orthogonal projection, on the substrate 101, of the first edge Al of the second electrode block 121 and the orthogonal projection, on the substrate 101, of the first edge A1 is a first distance a, a distance (i.e., a minimum distance) between an edge of the orthogonal projection, on the substrate 101, of the light-emitting layer 130 covered by the second electrode block 121 proximate to an orthogonal projection, on the substrate 101, of the second edge A2 of the second electrode block 121 and the orthogonal projection, on the substrate 101, of the second edge A2 is a second distance b, and the first distance a is less than the second distance b.

In this case, compared with a space between the edge of the orthogonal projection, on the substrate 101, of the light-emitting layer 130 proximate to the orthogonal projection, on the substrate 101, of the first edge A1 of the second electrode block 121 and the orthogonal projection, on the substrate 101 of the first edge A1, a space between the edge of the orthogonal projection, on the substrate 101, of the light-emitting layer 130 proximate to the orthogonal projection, on the substrate 101, of the second edge A2 of the second electrode block 121 and the orthogonal projection, on the substrate 101, of the second edge A2 is larger. Therefore, it may be convenient for the second electrode block 121 to overlap with a second electrode block 121 adjacent thereto; and it may prevent other second electrode blocks 121 overlapping with the second electrode block 121 from covering the light-emitting layer 130 covered by the second electrode block 121, and avoid an influence on the normal light exiting of the light-emitting layer 130.

In some embodiments, as shown in FIG. 4, widths w of overlapping portions of the two adjacent second electrode blocks 121 are less than or equal to a difference between the second distance b and the first distance a. A width of an overlapping portion of the second electrode block 121 may be a size thereof in a direction perpendicular to the extension direction of the second edge A2 of the second electrode block 121

It will be understood that a space between the overlapping portion and the light-emitting layer 130 is not zero. In this way, it may be possible to prevent other second electrode blocks 121 overlapping with the second electrode block 121 from covering the light-emitting layer 130 and affecting the normal light exiting of the light-emitting layer 130.

In some embodiments, as shown in FIG. 4, a distance (i.e., a minimum distance) c between an edge of an orthogonal projection, on the substrate 101, of a second electrode block 121 overlapping with the second electrode block 121 proximate to the orthogonal projection, on the substrate 101, of the light-emitting layer 130 and the orthogonal projection, on the substrate 101, of the light-emitting layer 130 is equal to the first distance a.

In this case, in a process of forming the second electrode 120 including the plurality of second electrode blocks 121, allowable overlapping offset ranges of second electrode blocks 121 overlapping with the second electrode block 121 at edges of the light-emitting layer 130 covered by the second electrode block 121 may be made approximately equal. For example, for two second electrode blocks 121 overlapping with the second electrode block 121, an overlapping offset of one of the two second electrode blocks 121 is approximate to an overlapping offset of the other of the two second electrode blocks 121, so that a distribution of the second electrode blocks 121 is uniform.

In some embodiments, in the second electrode 120, overlapping portions of any two adjacent second electrode blocks 121 have a same width. In this way, distribution of second electrode blocks 121 in the display panel 100 is uniform.

For example, the first distance a is in a range of 10 μm to 12 μm, inclusive, the second distance b is in a range of 16 μm to 20 μm, inclusive, and a width of a portion (i.e., an overlapping portion) of the second electrode block 121 that overlaps with an adjacent second electrode block 121 is in a range of 6 μm to 8 μm, inclusive. For example, the first distance a is 11 μm, the second distance b is 18 μm, and the width of the portion of the second electrode block 121 that overlaps with the adjacent second electrode block 121 is 7 μm.

In some embodiments, a shape of the orthogonal projection, on the substrate 101, of the second electrode block 121 is the same as a shape of the orthogonal projection, on the substrate 101, of the light-emitting layer 130 covered by the second electrode block 121.

In addition, a shape of the orthogonal projection, on the substrate 101, of the first electrode block 111 is the same as the shape of the orthogonal projection, on the substrate 101, of the light-emitting layer 130.

Figure 5:
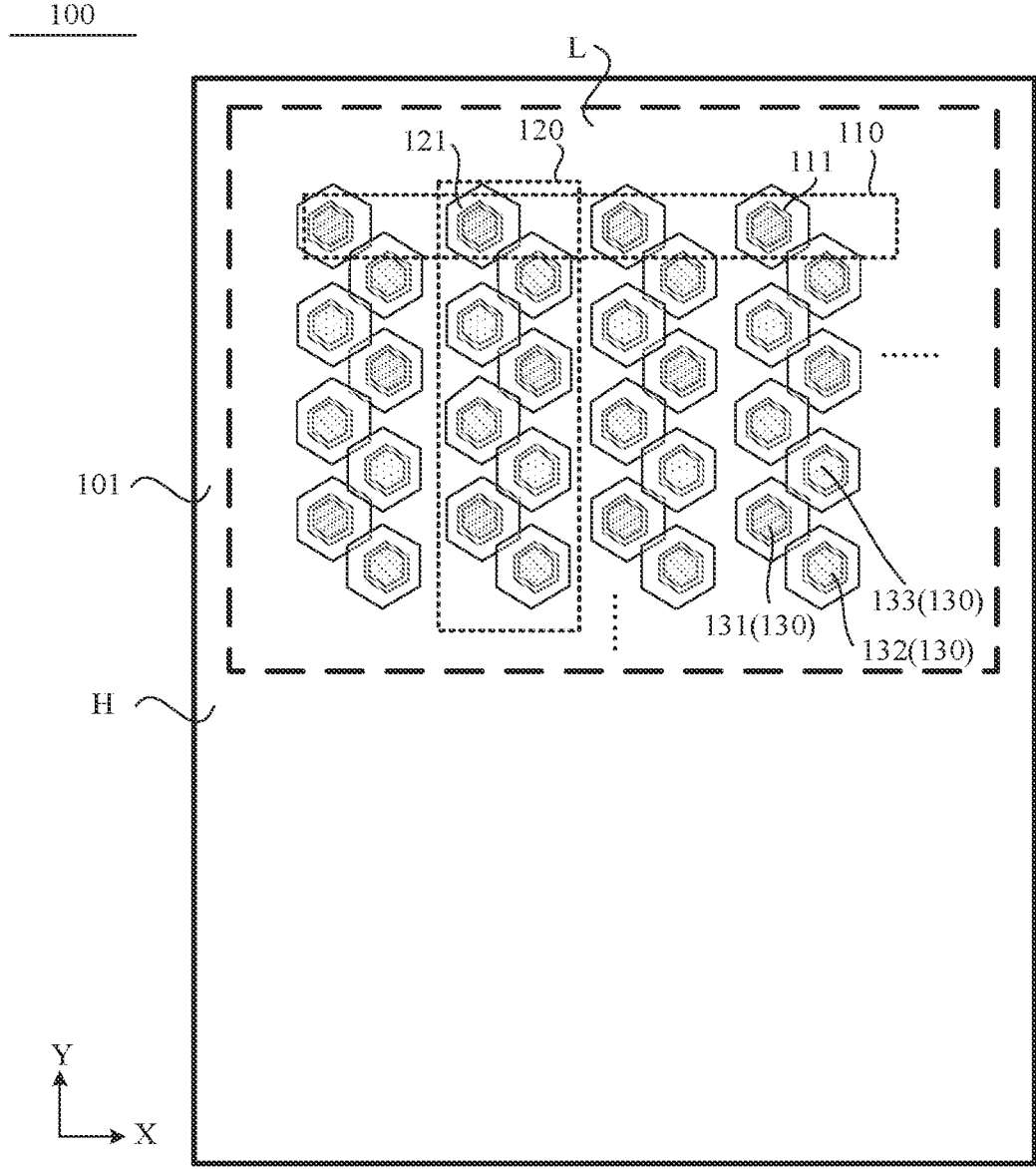
FIG. 5 is a structural diagram of yet another display panel, in accordance with some embodiments.

For example, the shape of the orthogonal projection, on the substrate 101, of the second electrode block 121 is a quadrilateral (as shown in FIG. 4), a hexagonal (as shown in FIG. 5), a circle or an ellipse.

It will be noted that a person skilled in the art may design a shape and a size of the second electrode block 121 according to actual needs, which is not limited here.

In some embodiments, as shown in FIG. 4, in the second electrode 120, an extension direction of a line q1 connecting geometric centers O2 of two second electrode blocks 121 overlapping with the second electrode block 121 is parallel or substantially parallel to the second direction Y.

An included angle between an extension direction of a line q2 connecting geometric centers O2 of any two adjacent second electrode blocks 121 and the first direction X is an acute angle.

For example, the acute angle is in a range of 30° to 60°, inclusive. For example, the acute angle is 45°.

In this case, compared with a case where an included angle between an extension direction of a line connecting geometric centers of two second electrode blocks 121 overlapping with each other and the first direction X is approximately zero, or an extension direction of a line connecting geometric centers of two second electrode blocks 121 overlapping with each other is parallel to the second direction Y, in the embodiments of the present disclosure, the included angle between the extension direction of the line connecting the geometric centers of the two second electrode blocks 121 overlapping with each other and the first direction X is the acute angle, so that an area of the orthogonal projection, on the substrate 101, of the second electrode 120 may be reduced, and a space occupied by the second electrode 120 may be saved. As a result, the transmittance of the display panel 100 is improved.

In some embodiments, as shown in FIG. 2, the plurality of light-emitting layers 130 include light-emitting layers of a first color 131, light-emitting layers of a second color 132, and light-emitting layers of a third color 133.

For example, the first color, the second color, and the third color are three primary colors. For example, the first color, the second color, and the third color are red, green, and blue, respectively.

Light emitted by light-emitting layers 130 covered by the first electrode 110 has a same color; and in a region where each second electrode 120 is located, light-emitting layers of the first color 131, light-emitting layers of the second color 132, and light-emitting layers of the third color 133 are arranged sequentially and cyclically and staggered, and light emitted by adjacent light-emitting layers have different colors.

For example, in the region where the second electrode 120 is located, in the second direction Y, an extension direction of a line connecting geometric centers of the light-emitting layer of the second color 132 and the light-emitting layer of the third color 133 that are most adjacent to the light-emitting layer of the first color 131 is parallel to the second direction Y.

In the second direction Y, in the region where the second electrode 120 is located, a line sequentially connecting the geometric centers of the light-emitting layers 130, i.e., a line sequentially connecting the geometric centers of the light-emitting layers of the first color 131, the light-emitting layers of the second color 132, and the light-emitting layers of the third color 133, is a broken line. In addition, a line sequentially connecting geometric centers of light-emitting layers of a same color is a broken line.

In this case, since the light-emitting layers 130 in the region where the second electrode 120 is located are arranged in a staggered manner in the second direction Y, in a process of forming the second electrode 120 on a side of the light-emitting layers 130 away from the substrate 101, the formed second electrode blocks 121 in the second electrode 120 covering the light-emitting layers 130 may be arranged in a staggered manner.

It will be noted that sizes of light exiting areas of the light-emitting layer of the first color 131, the light-emitting layer of the second color 132, and the light-emitting layer of the third color 133 may be adjusted according to actual needs, that is, an area ratio of each sub-pixel to a pixel may be adjusted, and details are not limited here. In a case where the light exiting area of each light-emitting layer 130 is adjusted, an area of a second electrode block 121 covering the light-emitting layer 130 may also be adjusted accordingly.

In some embodiments, as shown in FIG. 4, the plurality of second electrode blocks 121 in the second electrode 120 are divided into a plurality of electrode block groups 1201, and each electrode block group 1201 includes six second electrode blocks 121 that overlap sequentially.

It will be understood that two adjacent electrode block groups 1201 overlap with each other.

A distance between geometric centers of two light-emitting layers 130 of a same color in light-emitting layers 130 covered by the six second electrode blocks 121 in the electrode block group 1201 in the second direction Y is equal to a distance between geometric centers of two adjacent light-emitting layers 130 of a same color in a region where the first electrode 110 is located in the first direction X.

For example, as shown in FIG. 4, the light-emitting layers 130 covered by the six second electrode blocks 121 in the electrode block group 1201 are a light-emitting layer of the first color 131, a light-emitting layer of the second color 132, a light-emitting layer of the third color 132, a light-emitting layer of the first color 131, a light-emitting layer of the second color 132, and a light-emitting layer of the third color 132 in sequence. In this case, in the second direction Y, a distance between geometric centers O1 of two light-emitting layers of the first color 131 is v1, a distance between geometric centers O1 of two light-emitting layers of the second color 132 is v2, and a distance between geometric centers O1 of two light-emitting layers of the third color 133 is v3.

Moreover, in a case where light-emitting layers 130 covered by a first electrode 110 are light-emitting layers of the first color 131, in a region where the first electrode 110 is located, a distance between geometric centers O1 of two adjacent light-emitting layers of the first color 131 in the first direction X is h1. In a case where light-emitting layers 130 covered by a first electrode 110 are light-emitting layers of the second color 132, in a region where the first electrode 110 is located, a distance between geometric centers O1 of two adjacent light-emitting layers of the second color 132 in the first direction X is h2. In a case where light-emitting layers 130 covered by a first electrode 110 are light-emitting layers of the third color 133, in a region where the first electrode 110 is located, a distance between geometric centers O1 of two adjacent light-emitting layers of the third color 133 in the first direction X is h3.

Therefore, v1 is equal to h1 (v1=h1), v2 is equal to h2 (v2=h2), and v3 is equal to h3 (v3=h3). In addition, v1, v2, and v3 are equal (v1=v2=v3), and h1, h2, and h3 are equal (h1=h2=h3), In this case, light-emitting layers of the first color 131, light-emitting layers of the second color 132, and light-emitting layers of the third color 133 in the first region L are all uniformly distributed. In this way, uniformity of a display image of the display panel 100 may be ensured.

In some embodiments, as shown in FIG. 2, the scanning signal line SL includes a first line segment L1 and a second line segment L2 coupled to the first line segment L1.

The first line segment L1 extends in the first direction X, and the second line segment L2 extends in the second direction Y.

The first line segment L1 connects the plurality of first electrode blocks 111 in the first electrode 110 in series.

An extension direction of a line sequentially connecting geometric centers of first electrode blocks 111 coupled to a first line segment L1 is the same as an extension direction of the first line segment L1. That is, both the line and the first line segment L1 extend in the first direction X. In this way, it may be possible to ensure that the scanning signal transmitted by the scanning signal line SL may be normally transmitted to sub-pixels located in the region where the first electrode 110 is located, and thus the sub-pixels are controlled to emit light.

In addition, the display panel 100 further includes an insulating layer disposed between the first electrodes 110 and the scanning signal lines SL, a plurality of via holes are disposed on the insulating layer, and the first electrode block 111 is coupled to the first line segment L1 through via hole(s).

For example, a plurality of second line segments L2 of the plurality of scanning signal lines SL are located on two opposite sides of the plurality of first electrodes 110 in the first direction X (as shown in FIG. 2). In this case, the plurality of scanning signal lines SL in the display panel 100 may respectively transmit scanning signals to the plurality of first electrodes 110 from the two opposite sides in the first direction X, thereby avoiding a voltage drop of the scanning signal line SL in a process of transmitting a signal, and improving uniformity of display.

For example, the plurality of second line segments L2 of the plurality of scanning signal lines SL are located on one of the two opposite sides of the plurality of first electrodes 110 in the first direction X (which is not shown in the figure). In this way, it may facilitate wirings of the display panel 100.

It will be noted that a person skilled in the art may design positions of the plurality of second line segments L2 of the plurality of scanning signal lines SL, according to actual situations such as a size of the display panel 100 and a size of an actual wiring region, and details will not be limited here.

In some embodiments, as shown in FIG. 2, in a case where the plurality of second line segments L2 of the plurality of scanning signal lines SL are located on the two opposite sides of the plurality of first electrodes 110 in the first direction X, one of any two adjacent first electrodes 110 is coupled to a second line segment L2, which is located on a side of the plurality of first electrodes 110 in the first direction X, of a scanning signal line SL, and the other of the any two adjacent first electrodes 110 is coupled to another second line segment L2, which is located on the other side of the plurality of first electrodes 110 in the first direction X, of another scanning signal line SL.

For example, in the second direction Y, odd-numbered first electrodes 110 are coupled to second line segments L2 located on one side of the plurality of first electrodes 110 in the first direction X, and even-numbered first electrodes 110 are coupled to second line segments L2 located on the other side of the plurality of first electrodes 110 in the first direction X.

In this case, the plurality of second line segments L2, which are located on the two opposite sides of the plurality of first electrodes 110 in the first direction X, of the plurality of scanning signal lines SL may alternately transmit scanning signals to the plurality of first electrodes 110, so that in the second direction Y, the plurality of first electrodes 110 receive the scanning signals one by one.

In some embodiments, the plurality of scanning signal lines SL and the plurality of data signal lines DL are arranged in a same layer and made of a same material. In this way, the plurality of scanning signal lines SL and the plurality of data signal lines DL may be formed simultaneously, thereby simplifying production processes.

For example, a material of the plurality of scanning signal lines SL and a material of the plurality of data signal lines DL may each include a metal material, such as molybdenum (Mo), copper (Cu), and aluminum (Al).

In some embodiments, as shown in FIG. 2, the plurality of data signal lines DL are located on a side of the plurality of second electrodes 120 away from the second region H in the second direction Y. In this way, it may be possible to prevent the plurality of data signal lines DL from affecting a size of a region where the display panel 100 performs normal display, so that an area of the region where the display panel 100 performs the normal display is increased.

Figure 6:
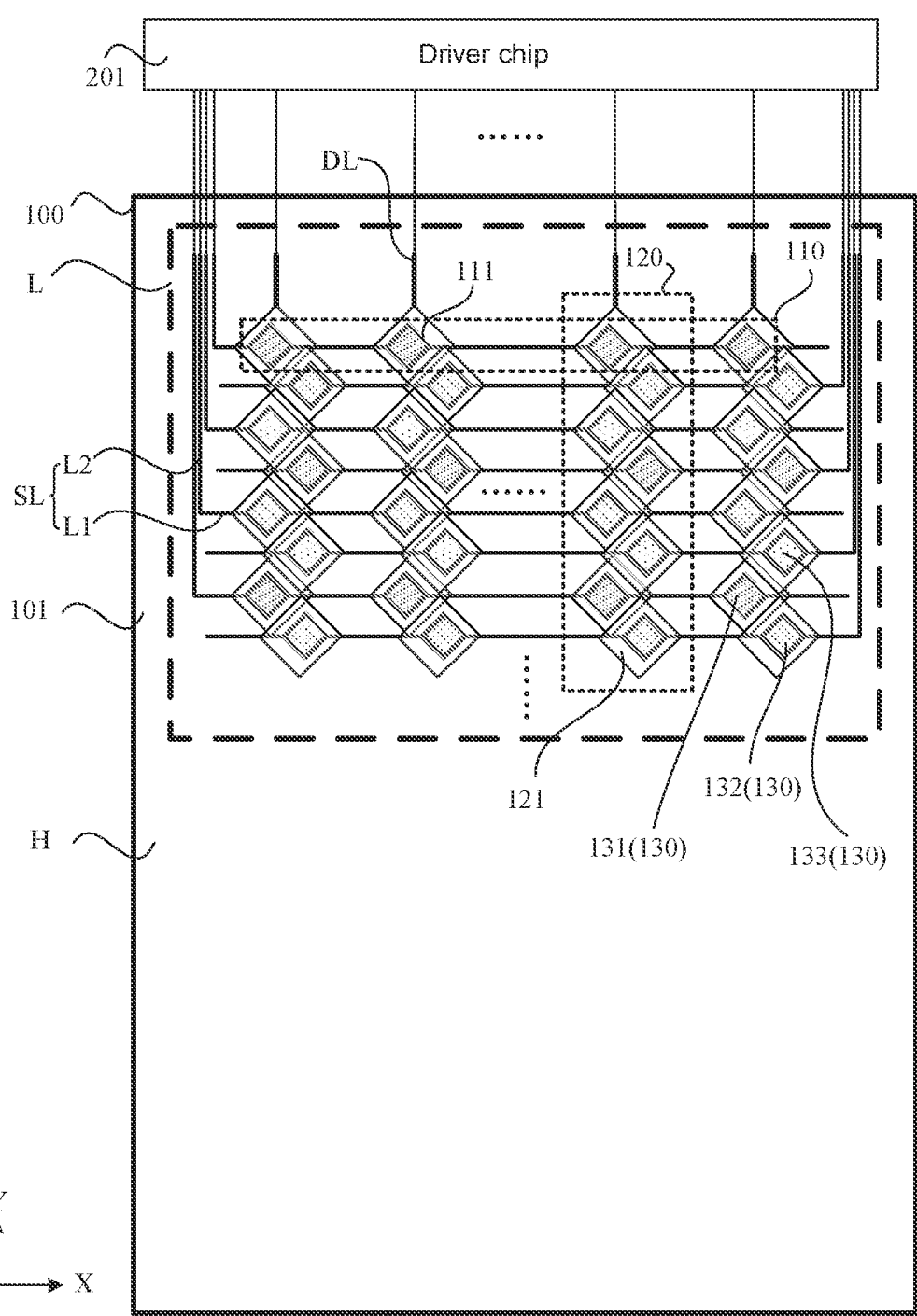
FIG. 6 is a structural diagram of a display apparatus, in accordance with some embodiments.

The embodiments of the present disclosure provide a display apparatus 200. As shown in FIG. 6, the display apparatus 200 includes the display panel 100 as described in any of the above embodiments and a driver chip 201.

The driver chip 201 is bonded to the display panel 100 and coupled to the plurality of data signal lines DL in the display panel 100.

The driver chip 201 is configured to provide data signals to the plurality of data signal lines DL.

The driver chip 201 is an integrated circuit (IC).

It will be understood that the data signal lines DL may be used as pins for coupling the second electrodes 120 with the driver chip 201.

As shown in FIG. 6, the plurality of scanning signal lines SL may also be coupled to the driver chip 201, and the driver chip 201 is further configured to provide the scanning signals to the plurality of scanning signal lines SL. Alternatively, the plurality of scanning signal lines SL may be coupled to a driving circuit disposed on the substrate 101, and the driving circuit is configured to provide the scanning signals to the plurality of scanning signal lines SL. The present disclosure is not limited thereto.

For example, the display apparatus 200 may be any apparatus that displays images whether in motion (e.g., videos) or stationary (e.g., static images), and whether literal or graphical. More specifically, it is anticipated that the embodiments may be implemented in or associated with a variety of electronic apparatuses. The variety of electronic apparatuses include (but are not limited to), for example, a mobile phone, a wireless device, a personal data assistants (PDA), a hand-held or portable computer, a global positioning system (GPS) receiver/navigator, a camera, a MP4 video player, a video camera, a game console, a watch, a clock, a calculator, a television monitor, a flat-panel display, a computer monitor, a car displays (e.g., an odometer display), a navigator, a cockpit controller and/or display, a camera view display (e.g., a rear view camera display in a vehicle), an electronic photo, an electronic billboard or sign, a projector, a building structure, a packaging structure, and an aesthetic structure (e.g., a display for an image of a piece of jewelry).

It will be noted that the display apparatus 200 has same beneficial effects as the display panel 100 described above, and details will not be repeated here.

The embodiments of the present disclosure provide a method for manufacturing the display panel 100 in any of the above embodiments. As shown in FIG. 7, the method manufacturing for the display panel 100 includes the following steps.

In step 10 (S10), the substrate 101 is provided.

Figure 9A:
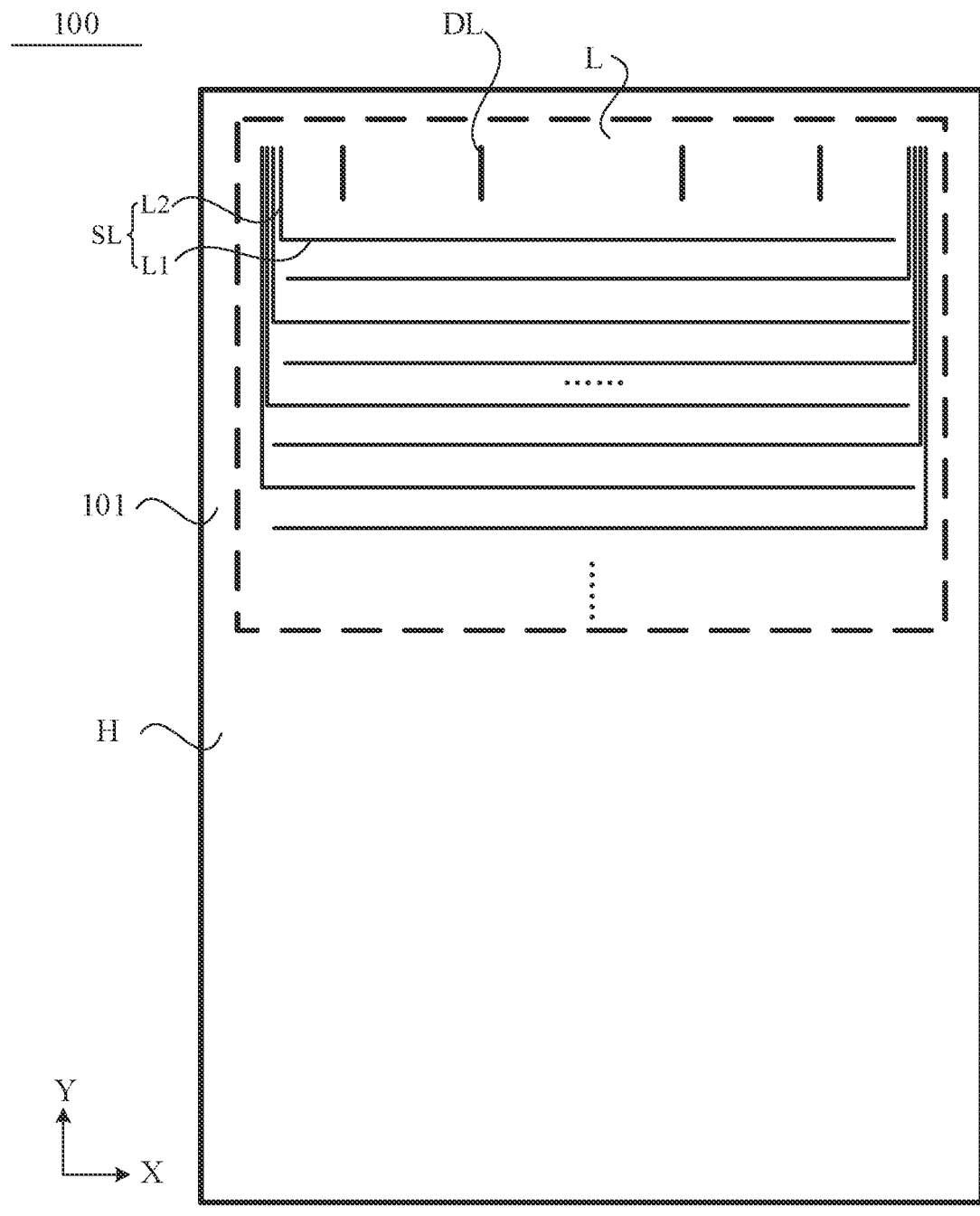
FIGS. 9A to 9G are diagrams showing steps in a method for manufacturing a display panel, in accordance with some embodiments.

In step 20 (S20), as shown in FIG. 9A, the plurality of scanning signal lines SL and the plurality of data signal lines DL are formed on the substrate 101 and in the first region L of the substrate 101.

For example, in a case where the display panel 100 includes a pixel driving circuit disposed in each sub-pixel region of the second region H and data lines coupled to pixel driving circuits, the plurality of scanning signal lines SL and the plurality of data signal lines DL are arranged in a same layer and made of a same material as the data lines. That is, the plurality of scanning signal lines SL, the plurality of data signal lines DL, and the data lines are formed simultaneously.

Figure 9B:
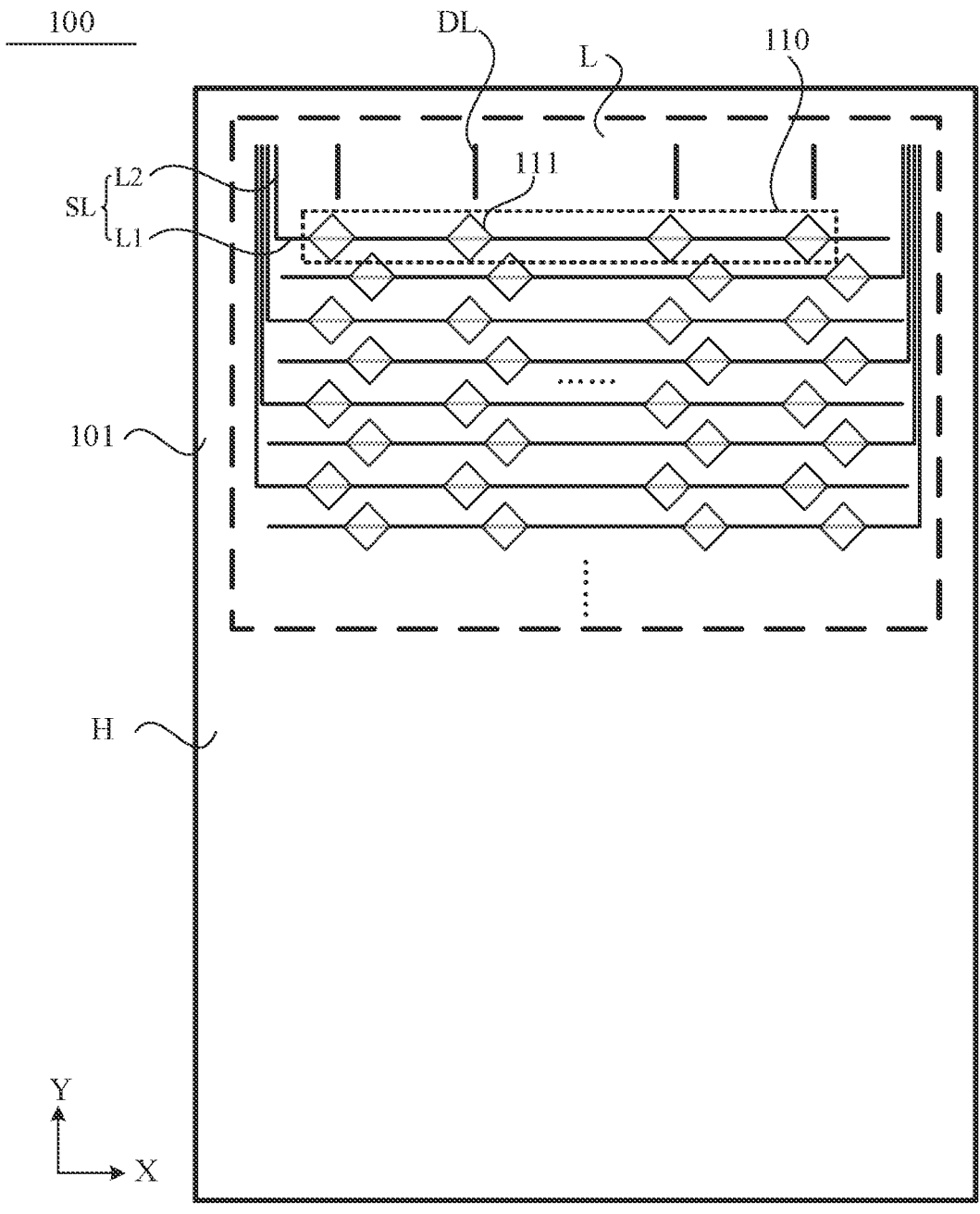

In step 30 (S30), as shown in FIG. 9B, the plurality of first electrodes 110 are formed on the substrate 101 on which the plurality of scanning signal lines SL have been formed, the first electrodes 110 extend in the first direction X, and a first electrode 110 is coupled to a scanning signal line SL.

For example, the first electrode 110 may be made of a metal material (e.g., argentum (Ag)) or a transparent conductive material (e.g., indium tin oxid (ITO)).

In a case where the first electrode 110 includes the plurality of first electrode blocks 111, the plurality of first electrodes 110 may be formed through a patterning process. For example, the patterning process may include film formation, exposure, development, and etching processes. In this case, an insulating layer may be formed on the side of the plurality of scanning signal lines SL away from the substrate 101; a material for forming the first electrodes 110 may be deposited on a surface of the insulating layer away from the substrate 101 to form a conductive film; a surface of the conductive film away from the substrate 101 is coated with photoresist; and a portion of the conductive film other than portions thereof located in regions where the first electrodes 110 are to be formed and the photoresist are removed, so as to obtain the first electrode 110 including the plurality of first electrode blocks 111.

Figure 9C:
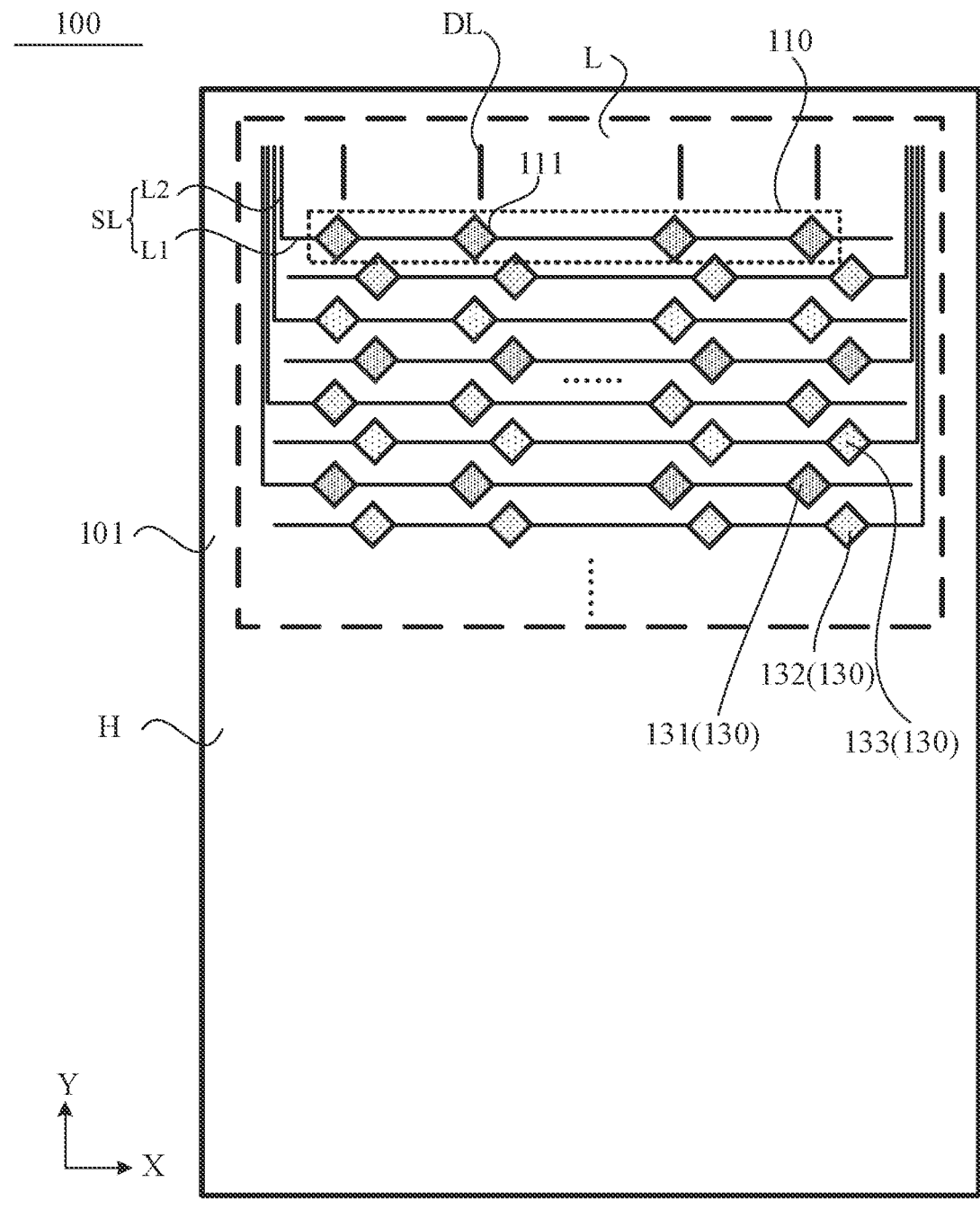

In step 40 (S40), as shown in FIG. 9C, the plurality of light-emitting layers 130 are formed on the substrate 101 on which the plurality of first electrodes 110 have been formed.

It will be understood that before the plurality of light-emitting layers 130 are formed, a pixel defining layer (PDL) may be formed on the substrate 101 on which the first electrodes 110 have been formed, the pixel defining layer includes a plurality of openings, and an opening of the pixel defining layer define a light exiting region of a sub-pixel P. A light-emitting layer 130 is located in the opening.

It will be noted that in an actual production process, an edge of an orthogonal projection, on the substrate 101, of the light-emitting layer 130 may exceed an edge of an orthogonal projection, on the substrate 101, of the opening in the pixel defining layer, that is, an area of the light-emitting layer 130 is greater than a light exiting area of the sub-pixel P, which will be ignored in the embodiments of the present disclosure. Therefore, the edge of the orthogonal projection, on the substrate 101, of the light-emitting layer 130 described in the embodiments of the present disclosure is regarded as an edge of the light exiting region of the sub-pixel P.

In step 50 (S50), referring to FIG. 2, the plurality of second electrodes 120 are formed on the substrate 101 on which the plurality of light-emitting layers 130 have been formed; the second electrode 120 extend in the second direction Y; the second electrode 120 is coupled to the data signal line DL; the second electrode 120 includes the plurality of second electrode blocks 121, the second electrode block 121 covers the light-emitting layer 130, and the edges proximate to each other of the any two adjacent second electrode blocks 121 in the second electrode 120 overlap; and the plurality of second electrode blocks 121 in the second electrode 120 are staggered in the second direction Y.

For example, the second electrodes 120 may be made of a metal material (e.g., Ag, Al and magnesium (Mg)) or a transparent conductive material (e.g., ITO).

Therefore, in the method for manufacturing the display panel 100 provided in the embodiments of the present disclosure, the second electrode 120 includes the plurality of second electrode blocks 121, the second electrode block 121 covers the light-emitting layer 130, the edges that are proximate to each other of the any two adjacent second electrode blocks 121 in the second electrode 120 overlap, and the plurality of second electrode blocks 121 in the second electrode 120 are staggered in the second direction Y. In this case, the adjacent second electrode blocks 121 in the second electrode 120 directly overlap, and there is no need to form the connection pattern, which reduces production processes and improves production efficiency. In addition, the area of the regions where the second electrodes 120 are located is reduced, and the area ratio of the second electrodes 120 to the display panel 100 is reduced, so that the transmittance of the display panel 100 is improved. In this way, in a case where the sensor (e.g., the camera) is disposed in the first region L, a good under-screen sensing effect may be achieved. Furthermore, there is no need to form spacers in the display panel 100, which reduces the production processes, improves the production efficiency; and a glare phenomenon of the camera under the display panel 100 due to interference of light passing through the spacers is avoided, and a shooting effect of the camera is improved.

In some embodiments, referring to FIG. 2, the plurality of light-emitting layers 130 include light-emitting layers of a first color 131, light-emitting layers of a second color 132, and light-emitting layers of a third color 133.

Forming the plurality of second electrodes 120 on the substrate 101 on which the plurality of light-emitting layers 130 have been formed, as shown in FIG. 8, includes the following steps.

Figure 9D:
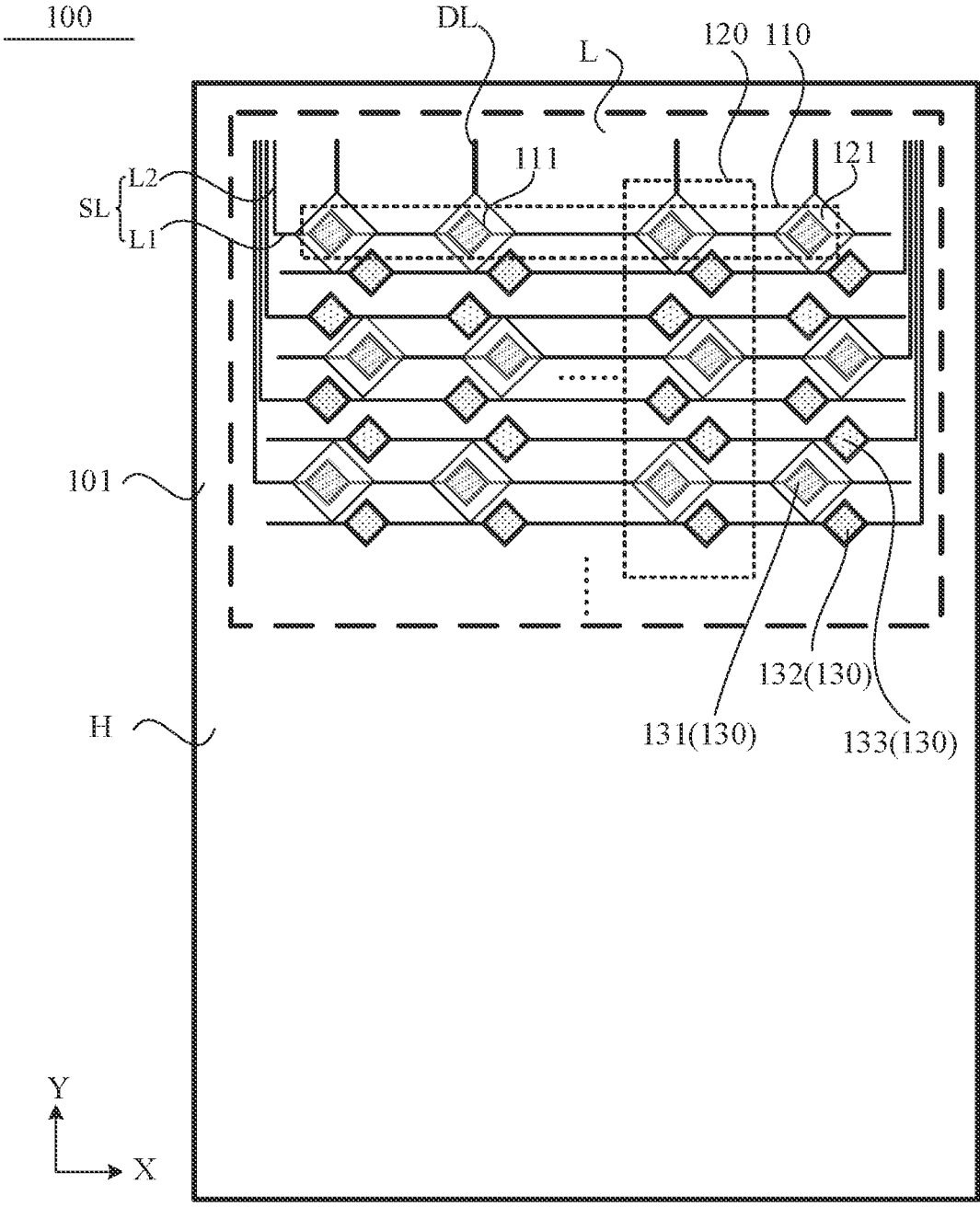
Figure 9E:
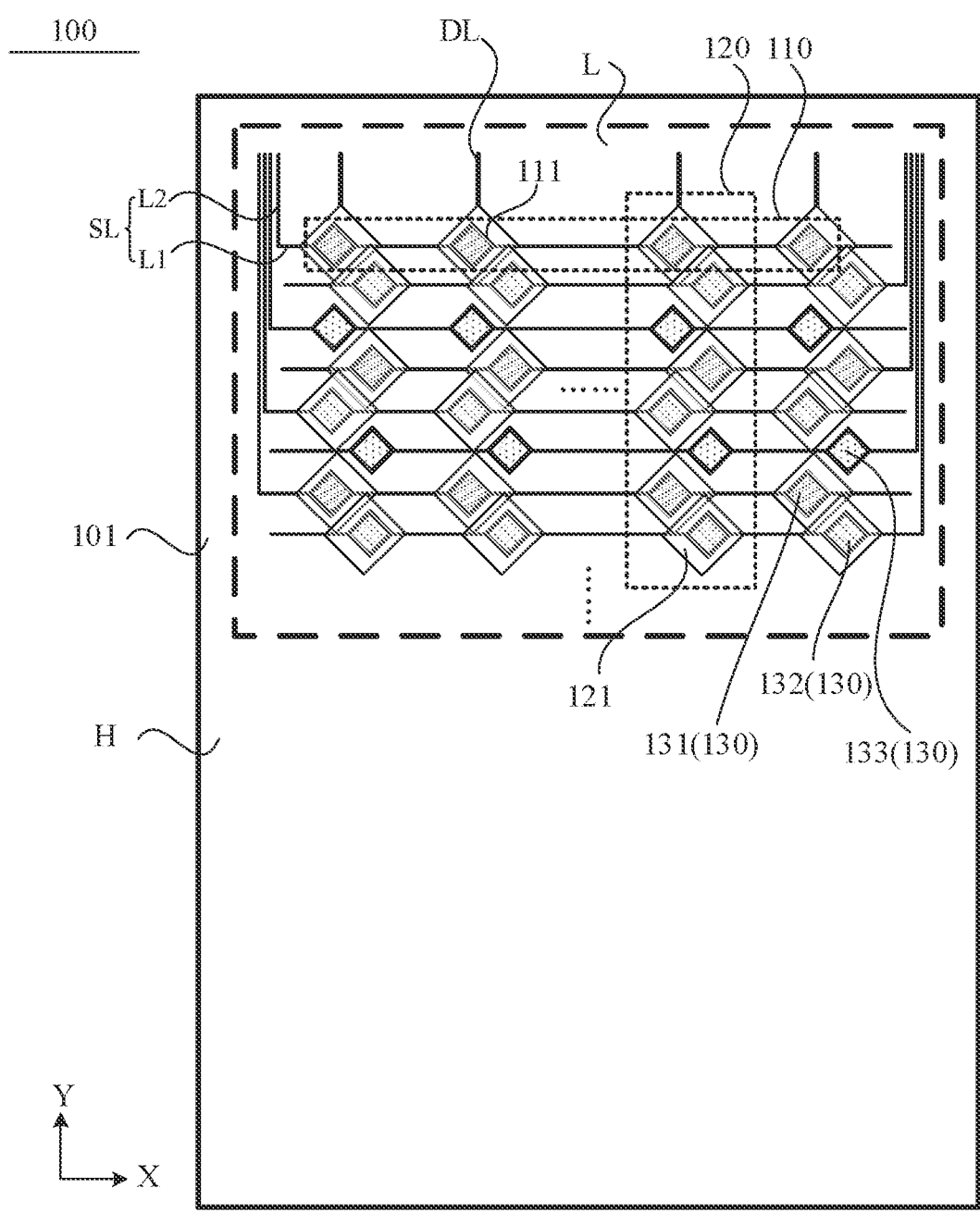
Figure 9F:
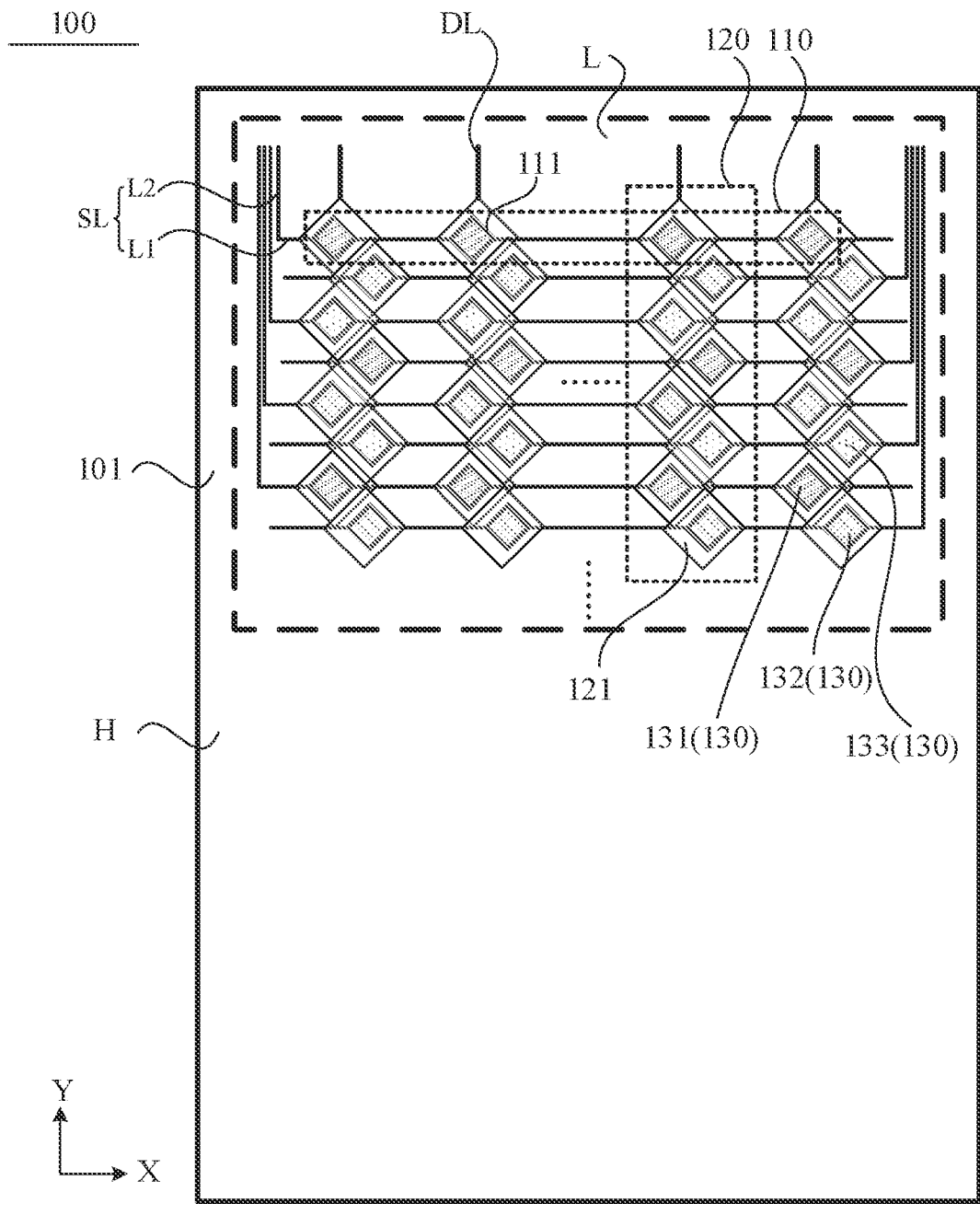
Figure 9G:
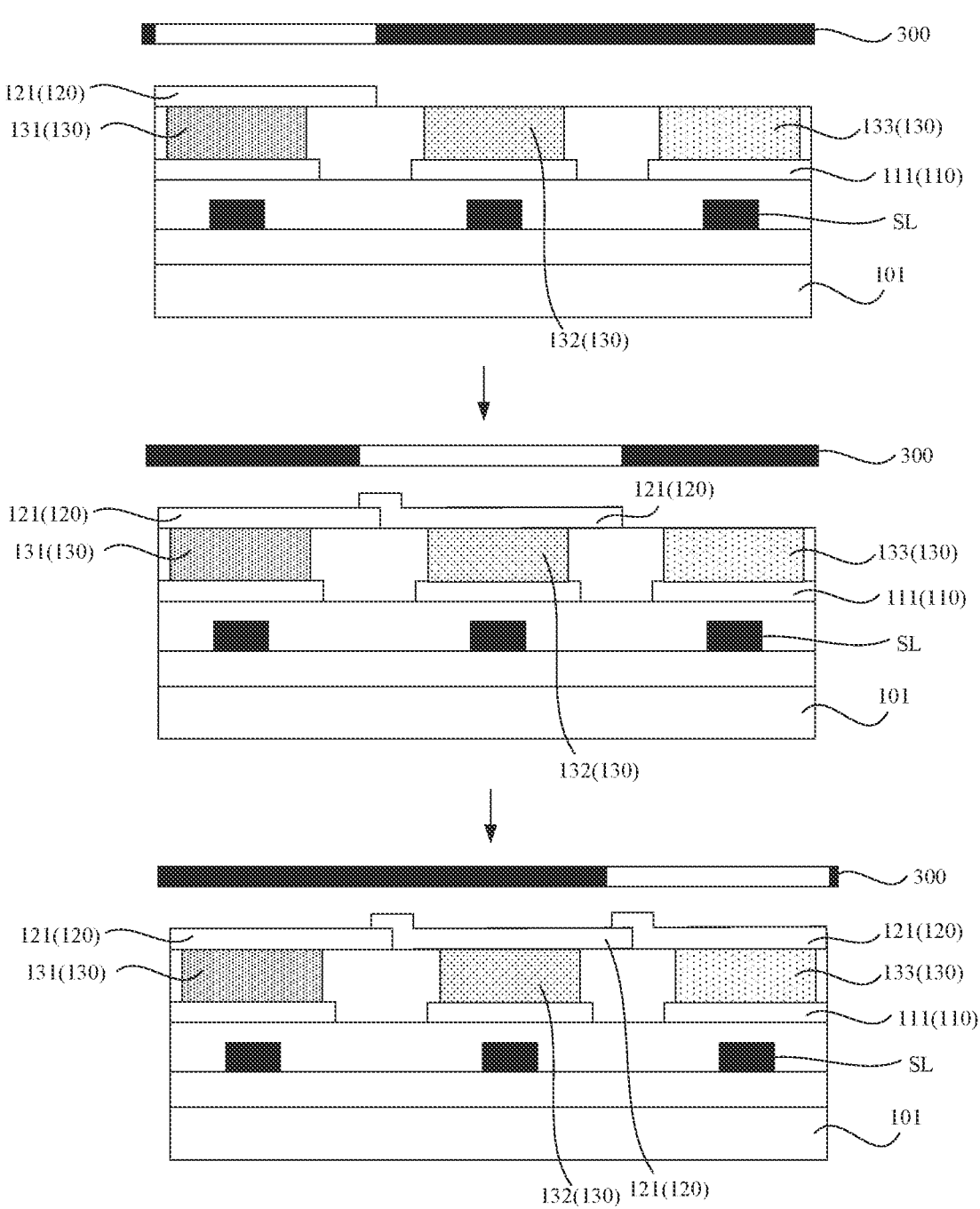

In step 501 (S501), as shown in FIGS. 9D and 9G, a material for forming the second electrodes 120 is evaporated on surfaces of the light-emitting layers of the first color 131 away from the substrate 101 by using a mask 300, so as to form second electrode blocks 121 covering the light-emitting layers of the first color 131

In step 502 (S502), as shown in FIGS. 9E and 9G, the mask 300 is moved; the material for forming the second electrodes 120 is evaporated on surfaces of the light-emitting layers of the second color 132 away from the substrate 101 by using the moved mask 300, so as to form second electrode blocks 121 covering the light-emitting layers of the second color 132; and edges proximate to each other of the second electrode block 121 covering the light-emitting layer of the second color 132 and the second electrode block 121 covering the light-emitting layer 131 of the first color overlap.

In step 503 (S503), as shown in FIGS. 9F and 9G, the mask 300 is re-moved; the material for forming the second electrodes 120 is evaporated on surfaces of the light-emitting layers of the third color 133 away from the substrate 101 by using the re-moved mask 300, so as to form second electrode blocks 121 covering the light-emitting layers of the third color 133; edges proximate to each other of the second electrode block 121 covering the light-emitting layer of the third color 133 and the second electrode block 121 covering the light-emitting layer of the first color 131 overlap; and edges proximate to each other of the second electrode block 121 covering the light-emitting layer of the third color 133 and the second electrode block 121 covering the light-emitting layer of the second color 132 overlap.

In this case, through evaporation processes, the plurality of second electrode blocks 121 in the second electrode 120 may be formed by moving the mask repeatedly, without replacing the mask, which reduces production costs, shortens production time; and improves the production efficiency.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, the display panel having a first region and a second region, the first region and the second region being each provided with a plurality of sub-pixels therein, a distribution density of sub-pixels in the first region being less than a distribution density of sub-pixels in the second region;

the display panel comprising:

a substrate;

a plurality of first electrodes disposed on the substrate and located in the first region, each first electrode extending in a first direction, and the first electrode including a plurality of first electrode blocks;

a plurality of light-emitting layers disposed on a side of the plurality of first electrodes away from the substrate, a light-emitting layer being located in a sub-pixel, and an orthogonal projection, on the substrate, of the light-emitting layer being located in an orthogonal projection, on the substrate, of a first electrode block;

a plurality of second electrodes disposed on a side of the plurality of light-emitting layers away from the substrate, wherein each second electrode extends in a second direction, the first direction intersecting the second direction; the second electrode includes a plurality of second electrode blocks, a second electrode block covers the light-emitting layer, and in a direction perpendicular to both the first direction and the second direction, any two adjacent second electrode blocks in the second electrode overlap at edges proximate to each other and have an overlap region; and the any two adjacent second electrode blocks in the second electrode are staggered in the second direction;

a plurality of scanning signal lines disposed on the substrate, a scanning signal line connecting the plurality of first electrode blocks in the first electrode in series; and a plurality of data signal lines disposed on the substrate, a data signal line being coupled to the second electrode.

2. The display panel according to claim 1, wherein a geometric center of the second electrode block does not coincide with a geometric center of the light-emitting layer; and an orthogonal projection, on the substrate, of the light-emitting layer covered by the second electrode block does not overlap with an orthogonal projection, on the substrate, of a second electrode block overlapping with the second electrode block.

3. The display panel according to claim 1, wherein the second electrode block has a first edge and a second edge; the second edge of the second electrode block overlaps with a second electrode block adjacent to the second electrode block; the first edge of the second electrode block does not substantially overlap with the second electrode block adjacent to the second electrode block; and a distance between an edge of an orthogonal projection, on the substrate, of the light-emitting layer proximate to an orthogonal projection, on the substrate, of the first edge of the second electrode block and the orthogonal projection, on the substrate, of the first edge is a first distance, a distance between an edge of the orthogonal projection, on the substrate, of the light-emitting layer proximate to an orthogonal projection, on the substrate, of the second edge of the second electrode block and the orthogonal projection, on the substrate, of the second edge is a second distance, and the first distance is less than the second distance.

4. The display panel according to claim 3, wherein widths of overlapping portions of two adjacent second electrode blocks are less than or equal to a difference between the second distance and the first distance.

5. The display panel according to claim 3, wherein a distance between an edge of an orthogonal projection, on the substrate, of a second electrode block overlapping with the second electrode block proximate to the orthogonal projection, on the substrate, of the light-emitting layer and the orthogonal projection, on the substrate, of the light-emitting layer is equal to the first distance.

6. The display panel according to claim 3, wherein the first distance is in a range of 10 μm to 12 μm, inclusive, and the second distance is in a range of 16 μm to 20 μm, inclusive; and a width of a portion of the second electrode block overlapping with an adjacent second electrode block is in a range of 6 μm to 8 μm, inclusive.

7. The display panel according to claim 1, wherein a shape of an orthogonal projection, on the substrate, of the second electrode block and a shape of an orthogonal projection, on the substrate, of the light-emitting layer are same as a shape of an orthogonal projection, on the substrate, of the first electrode block; and the shape of the orthogonal projection, on the substrate, of the second electrode block is a quadrilateral.

8. The display panel according to claim 1, wherein in the second electrode, an extension direction of a line connecting geometric centers of two second electrode blocks overlapping with the second electrode block is parallel to the second direction; and an included angle between an extension direction of a line connecting geometric centers of any two adjacent second electrode blocks and the first direction is an acute angle.

9. The display panel according to claim 1, wherein in the second electrode, overlapping portions of any two adjacent second electrode blocks have a same width.

10. The display panel according to claim 1, wherein the plurality of light-emitting layers include light-emitting layers of a first color, light-emitting layers of a second color, and light-emitting layers of a third color;

light emitted by light-emitting layers covered by the first electrode has a same color; and in a region where the second electrode is located, light-emitting layers of the first color, light-emitting layers of the second color, and light-emitting layers of the third color are arranged sequentially and cyclically and staggered, and light emitted by adjacent light-emitting layers have different colors.

11. The display panel according to claim 10, wherein the plurality of second electrode blocks in the second electrode are divided into a plurality of electrode block groups, and each electrode block group includes six second electrode blocks that overlap sequentially; and a distance between geometric centers of two light-emitting layers of a same color in light-emitting layers covered by the six second electrode blocks in the electrode block group in the second direction is equal to a distance between geometric centers of two adjacent light-emitting layers of a same color in a region where the first electrode is located in the first direction.

12. The display panel according to claim 1, wherein the scanning signal line includes a first line segment and a second line segment coupled to the first line segment;

the first line segment extends in the first direction, and the second line segment extends in the second direction;

the first line segment connects the plurality of first electrode blocks in the first electrode in series; and a plurality of second line segments of the plurality of scanning signal lines are located on two opposite sides of the plurality of first electrodes in the first direction.

13. The display panel according to claim 12, wherein a first electrode of any two adjacent first electrodes is coupled to a second line segment, which is located on a side of the plurality of first electrodes in the first direction, of a scanning signal line; and another first electrode of the any two adjacent first electrodes is coupled to a second line segment, which is located on another side of the plurality of first electrodes in the first direction, of a scanning signal line.

14. The display panel according to claim 1, wherein the scanning signal line includes a first line segment and a second line segment coupled to the first line segment;

the first line segment extends in the first direction, and the second line segment extends in the second direction;

the first line segment connects the plurality of first electrode blocks in the first electrode in series; and a plurality of second line segments of the plurality of scanning signal lines are located on a side of two opposite sides of the plurality of first electrodes in the first direction.

15. The display panel according to claim 1, wherein the plurality of scanning signal lines and the plurality of data signal lines are arranged in a same layer and made of a same material.

16. The display panel according to claim 1, wherein the plurality of data signal lines are located on a side of the plurality of second electrodes away from the second region in the second direction.

17. A display apparatus, comprising:

the display panel according to claim 1; and a driver chip bonded to the display panel and coupled to the plurality of data signal lines in the display panel.

18. A method for manufacturing the display panel according to claim 1, the method comprising:

providing the substrate;

forming the plurality of scanning signal lines and the plurality of data signal lines on the substrate and in the first region of the substrate;

forming the plurality of first electrodes on the substrate on which the plurality of scanning signal lines have been formed, wherein each first electrode extends in the first direction, and the first electrode is coupled to the scanning signal line;

forming the plurality of light-emitting layers on the substrate on which the plurality of first electrodes have been formed; and forming the plurality of second electrodes on the substrate on which the plurality of light- emitting layers have been formed, wherein each second electrode extends in the second direction; the second electrode is coupled to the data signal line; the second electrode includes the plurality of second electrode blocks, the second electrode block covers the light-emitting layer, and in the direction perpendicular to both the first direction and the second direction, the any two adjacent second electrode blocks in the second electrode overlap at the edges proximate to each other and have the overlap region; and the any two adjacent second electrode blocks in the second electrode are staggered in the second direction.

19. The method according to claim 18, wherein the plurality of light-emitting layers include light-emitting layers of a first color, light-emitting layers of a second color, and light-emitting layers of a third color; and forming the plurality of second electrodes on the substrate on which the plurality of light-emitting layers have been formed includes:

evaporating a material for forming the second electrodes on surfaces of the light-emitting layers of the first color away from the substrate by using a mask, so as to form second electrode blocks covering the light-emitting layers of the first color;

moving the mask, and evaporating the material for forming the second electrodes on surfaces of the light-emitting layers of the second color away from the substrate by using the moved mask, so as to form second electrode blocks covering the light-emitting layers of the second color, wherein edges proximate to each other of a second electrode block covering a light-emitting layer of the second color and a second electrode block covering a light-emitting layer of the first color overlap; and re-moving the mask, and evaporating the material for forming the second electrodes on surfaces of the light-emitting layers of the third color away from the substrate by using the re-moved mask, so as to form second electrode blocks covering the light-emitting layers of the third color, wherein edges proximate to each other of a second electrode block covering a light-emitting layer of the third color and the second electrode block covering the light-emitting layer of the first color overlap, and the second electrode block covering the light-emitting layer of the third color and the second electrode block covering the light-emitting layer of the second color overlap at edges proximate to each other.

20. The display panel according to claim 1, wherein a shape of an orthogonal projection, on the substrate, of the second electrode block and a shape of an orthogonal projection, on the substrate, of the light-emitting layer are same as a shape of an orthogonal projection, on the substrate, of the first electrode block; and the shape of the orthogonal projection, on the substrate, of the second electrode block is a hexagon.

* * * * *